United States Patent
Fukuhara et al.

(10) Patent No.: US 10,522,493 B2
(45) Date of Patent: Dec. 31, 2019

(54) PASTE THERMOSETTING RESIN COMPOSITION, SEMICONDUCTOR COMPONENT, SEMICONDUCTOR MOUNTED ARTICLE, METHOD FOR MANUFACTURING SEMICONDUCTOR COMPONENT, AND METHOD FOR MANUFACTURING SEMICONDUCTOR MOUNTED ARTICLE

(71) Applicant: Panasonic Intellectual Property Management Co., Ltd., Osaka (JP)

(72) Inventors: Yasuo Fukuhara, Osaka (JP); Atsushi Yamaguchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 15 days.

(21) Appl. No.: 15/751,068

(22) PCT Filed: Dec. 6, 2016

(86) PCT No.: PCT/JP2016/005062
§ 371 (c)(1),
(2) Date: Feb. 7, 2018

(87) PCT Pub. No.: WO2017/110052
PCT Pub. Date: Jun. 29, 2017

(65) Prior Publication Data
US 2018/0233473 A1 Aug. 16, 2018

(30) Foreign Application Priority Data

Dec. 25, 2015 (JP) ................................ 2015-254674
Dec. 25, 2015 (JP) ................................ 2015-254675

(Continued)

(51) Int. Cl.
*H01L 23/00* (2006.01)
*B23K 1/00* (2006.01)
(Continued)

(52) U.S. Cl.
CPC ............ *H01L 24/13* (2013.01); *B23K 1/0016* (2013.01); *B23K 35/025* (2013.01);
(Continued)

(58) Field of Classification Search
CPC ......... H01L 24/13; H01L 24/16; H01L 24/81; H01L 2224/81191; H01L 2924/15311; H01L 2224/16227
See application file for complete search history.

(56) References Cited

U.S. PATENT DOCUMENTS 6,559,390 B1 * 5/2003 Tanaka ................. H01L 21/563
174/260
2010/0105798 A1 * 4/2010 Hasegawa ............ C08F 299/00
522/99
(Continued)

FOREIGN PATENT DOCUMENTS

JP    2004-202518    7/2004
JP    2006-015348    1/2006
(Continued)

OTHER PUBLICATIONS

International Search Report of PCT application No. PCT/JP2016/005062 dated Mar. 14, 2017.

*Primary Examiner* — Nduka E Ojeh
(74) *Attorney, Agent, or Firm* — Wenderoth, Lind & Ponack, L.L.P.

(57) ABSTRACT

Provided is a paste thermosetting resin composition containing solder powder, a thermosetting resin binder, an activator, and a thixotropy imparting agent. The solder powder has a melting point ranging from 100° C. to 240° C.,
(Continued)

inclusive. The thermosetting resin binder contains a main agent and a curing agent. The main agent contains a di- or higher functional oxetane compound.

32 Claims, 11 Drawing Sheets

(30) Foreign Application Priority Data

Dec. 25, 2015 (JP) .................................. 2015-254676
Dec. 25, 2015 (JP) .................................. 2015-254677

(51) Int. Cl.
| | |
|---|---|
| *B23K 35/02* | (2006.01) |
| *B23K 35/26* | (2006.01) |
| *B23K 35/36* | (2006.01) |
| *C08L 71/02* | (2006.01) |
| *B23K 101/40* | (2006.01) |

(52) U.S. Cl.
CPC .......... *B23K 35/262* (2013.01); *B23K 35/264* (2013.01); *B23K 35/3613* (2013.01); *C08L 71/02* (2013.01); *H01L 24/16* (2013.01); *H01L 24/81* (2013.01); *B23K 2101/40* (2018.08); *C08L 2203/20* (2013.01); *H01L 2224/10126* (2013.01); *H01L 2224/13111* (2013.01); *H01L 2224/13113* (2013.01); *H01L 2224/13139* (2013.01); *H01L 2224/13147* (2013.01); *H01L 2224/16227* (2013.01); *H01L 2224/81007* (2013.01); *H01L 2224/81815* (2013.01); *H01L 2924/014* (2013.01)

(56) References Cited

U.S. PATENT DOCUMENTS

| | | | | |
|---|---|---|---|---|
| 2012/0077401 | A1* | 3/2012 | Kotake | B32B 27/38 442/147 |
| 2012/0276392 | A1* | 11/2012 | Takahashi | B32B 15/08 428/418 |
| 2012/0309133 | A1* | 12/2012 | Wada | H05K 3/3436 438/124 |
| 2014/0060703 | A1* | 3/2014 | Pujari | B23K 35/3612 148/25 |
| 2014/0083567 | A1 | 3/2014 | Hamagawa et al. | |
| 2014/0110153 | A1* | 4/2014 | Kashiwagi | B22F 1/0074 174/251 |
| 2014/0178696 | A1* | 6/2014 | Yu | C08L 63/00 428/418 |
| 2015/0061129 | A1* | 3/2015 | Hattori | B23K 1/20 257/738 |
| 2015/0191588 | A1* | 7/2015 | Choi | C08K 3/04 428/220 |
| 2016/0086902 | A1* | 3/2016 | Lu | H01L 24/14 257/737 |

FOREIGN PATENT DOCUMENTS

| | | |
|---|---|---|
| JP | 2006015348 A * | 1/2006 |
| JP | 2006-057007 | 3/2006 |
| JP | 2011-176050 | 9/2011 |
| JP | 2012-084845 | 4/2012 |
| WO | 2012/042809 | 4/2012 |
| WO | 2012/160722 | 11/2012 |

* cited by examiner

PASTE THERMOSETTING RESIN COMPOSITION, SEMICONDUCTOR COMPONENT, SEMICONDUCTOR MOUNTED ARTICLE, METHOD FOR MANUFACTURING SEMICONDUCTOR COMPONENT, AND METHOD FOR MANUFACTURING SEMICONDUCTOR MOUNTED ARTICLE

TECHNICAL FIELD

The present invention relates to a paste thermosetting resin composition containing solder powder, a semiconductor component, a semiconductor mounted article, a method for manufacturing a semiconductor component, and a method for manufacturing a semiconductor mounted article.

BACKGROUND ART

Conventionally, used as a method for mounting an electronic component is a method for mounting a bump-attached electronic component on a substrate through solder bonding. However, mere solder bonding of the bump of the electronic component with an electrode of the substrate is low in bondability, so that the bonding is reinforced by partially fixing the electronic component to the substrate with a resin reinforcing material (for example, see Patent Literature 1).

A method is known that includes bonding a semiconductor component with a circuit board with use of a thermosetting resin composition containing solder particles (for example, Patent Literature 2). This method improves fall impact resistance of a semiconductor component mounted structure because a resin cured part covers circumference of a solder part formed through melting and integration of the solder particles.

A method is also known that improves bonding strength between a package component and a mounting substrate by curing a thermosetting resin composition in such a manner as to surround circumference of a solder ball bonding the package component with the mounting substrate (for example, see Patent Literature 3).

CITATION LIST

Patent Literatures

PTL 1: WO 2012/042809 A
PTL 2: Unexamined Japanese Patent Publication No. 2011-176050
PTL 3: Unexamined Japanese Patent Publication No. 2012-84845

SUMMARY OF THE INVENTION

A paste thermosetting resin composition according to the present invention contains solder powder, a thermosetting resin binder, an activator, and a thixotropy imparting agent. The solder powder has a melting point ranging from 100° C. to 240° C., inclusive, the thermosetting resin binder contains a main agent and a curing agent, and the main agent contains a di- or higher functional oxetane compound. Alternatively, the curing agent contains a benzoxazine compound having two or more benzoxazine rings.

According to the present invention, it is possible to prevent inhibition of melting and aggregation of solder powder in soldering regardless of a high or low melting point of the solder powder.

A semiconductor component according to the present invention includes a semiconductor package, a first substrate on a first surface of which a first pad is formed, a first solder bonding part that electrically connects the semiconductor package with the first pad, and a first resin reinforcing part that is formed in contact with the first solder bonding part and reinforces the first solder bonding part. The first resin reinforcing part is formed of a cured product of a first thermosetting resin binder containing at least one of a di- or higher functional oxetane compound and a benzoxazine compound having two or more oxazine rings.

A semiconductor mounted article according to the present invention includes a semiconductor package, a first substrate having a first surface on which a first pad is formed and a second surface on which a land is formed, the second surface opposing the first surface, a first solder bonding part that electrically connects the semiconductor package with the first pad, and a first resin reinforcing part that is formed in contact with the first solder bonding part and reinforces the first solder bonding part. The semiconductor mounted article also includes a second substrate on one surface of which a second pad is formed, a second solder bonding part that electrically connects the land with the second pad, and a second resin reinforcing part that is formed in contact with the second solder bonding part and reinforces the second solder bonding part. The first resin reinforcing part is formed of a cured product of a first thermosetting resin binder containing at least one of a di- or higher functional oxetane compound and a benzoxazine compound having two or more oxazine rings. The second resin reinforcing part is formed of a cured product of a second thermosetting resin binder containing at least one of a di- or higher functional oxetane compound and a benzoxazine compound having two or more oxazine rings.

A method for manufacturing a semiconductor component according to the present invention includes following steps A1 to D1. Step A1: preparing a semiconductor package on a second surface of which a first solder bump is formed and a first substrate on a first surface of which, in other words, on an opposite side to the second surface, a first pad is formed; step B1: printing on the first pad a first paste thermosetting resin composition containing solder powder that has a melting point ranging from 100° C. to 240° C., inclusive, at least one of a di- or higher functional oxetane compound and a benzoxazine compound having two or more oxazine rings, an activator, and a thixotropy imparting agent; step C1: disposing the first solder bump on the first pad; and step D1: performing reflow soldering by heating the semiconductor package and the first substrate for 4 minutes or more in such a manner that a peak temperature ranges from 220° C. to 260° C., inclusive.

A method for manufacturing a semiconductor mounted article according to the present invention includes following steps A2 to H2. Step A2: preparing a semiconductor package on one surface of which a first solder bump is formed, a first substrate on a first surface of which a first pad is formed and a second surface of which, in other words, on an opposite side from the first surface, a land is formed, and a second substrate on one surface of which a second pad is formed; step B2: printing on the first pad a first paste thermosetting resin composition containing solder powder that has a melting point ranging from 100° C. to 240° C., inclusive, at least one of a di- or higher functional oxetane compound and a benzoxazine compound having two or more oxazine rings, an activator, and a thixotropy imparting agent; step C2: disposing the first solder bump on the first pad; step D2: performing reflow soldering by heating the semiconductor package and the first substrate for 4 minutes or more in such a manner that a peak temperature ranges from 220° C. to 260° C., inclusive; step E2: forming a second solder bump on the land; step F2: printing on the second pad a second paste thermosetting resin composition containing solder powder that has a melting point ranging from 100° C. to 240° C., inclusive, at least one of a di- or higher functional oxetane compound and a benzoxazine compound having two or more oxazine rings, an activator, and a thixotropy imparting agent; step G2: disposing the second solder bump on the second pad; and step H2: performing reflow soldering by heating the semiconductor package, the first substrate, and the second substrate for 4 minutes or more in such a manner that a peak temperature ranges from 220° C. to 260° C., inclusive.

According to the present invention, an aggregation state of the solder powder is excellent.

DESCRIPTION OF EMBODIMENTS

Figure 1:
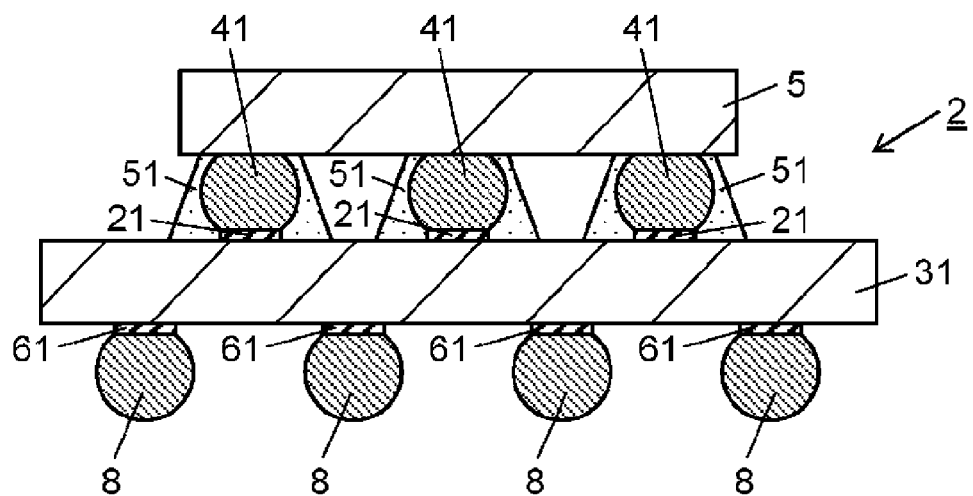
FIG. 1 is a schematic sectional view showing a semiconductor component according to a second exemplary embodiment of the present invention and showing a step E2 of a method for manufacturing a semiconductor mounted article according to the second exemplary embodiment of the present invention.

Prior to describing exemplary embodiments of the present invention, problems in a conventional device are briefly described.

A paste thermosetting resin composition containing solder powder as in Patent Literature 2 has following problems. In soldering, solder powder is melted, allowing solder to be aggregated and integrated (metalized). When a general epoxy resin is used as a thermosetting resin binder for Sn—Ag—Cu solder powder having a comparatively high melting point, the thermosetting resin binder inhibits the aggregation of solder. Such inhibition of self-aggregation of solder powder causes electrical conduction failure.

One cause of the phenomenon described above is that the thermosetting resin binder has much higher curing speed than aggregation speed of solder melted. In this case, it is considered that the thermosetting resin binder can complete a curing reaction faster than the solder powder melts and undergoes the self-aggregation, so that a cured product of the thermosetting resin binder is formed as an insulator among particles of the solder powder.

Another cause of inhibiting the self-aggregation of the solder powder is that the thermosetting resin binder has a much lower curing start temperature than a melting point of the solder powder. In this case, heating for soldering can allow the thermosetting resin binder to reach the curing start temperature first and then the solder powder to reach the melting point. Therefore, the thermosetting resin binder is considered to start curing first before the solder powder melts, to form an electrical insulator among particles of the solder powder.

With existing techniques, it has been difficult to slow the curing speed of the thermosetting resin binder or to raise the curing start temperature of the thermosetting resin binder.

The present invention is achieved in view of the points described above, and an object of the present invention is to provide a paste thermosetting resin composition that can prevent inhibition of melting and aggregation of solder powder in soldering regardless of a high or low melting point of the solder powder.

Hereinafter, the exemplary embodiments of the present invention are described.

First Exemplary Embodiment

[Paste Thermosetting Resin Composition]

A paste thermosetting resin composition according to the present exemplary embodiment contains solder powder, a thermosetting resin binder, an activator, and a thixotropy imparting agent. Hereinafter, described are these components constituting the paste thermosetting resin composition.
(Solder Powder)

Specific examples of the solder powder include solder powder of Sn—Ag—Cu (SAC), Sn—Bi, Sn—Pb, Pb—Sn—Sb, Sn—Sb, Sn—Pb—Bi, Sn—Cu, Sn—Pb—Cu, Sn—In, Sn—Ag, Sn—Pb—Ag, or Pb—Ag. Lead is harmful to humans and environments, so that lead-free solder is preferable. Specific examples of the lead-free solder include solder powder of Sn—Ag—Cu, Sn—Bi, Sn—Zn—Bi, Sn—Sb, Sn—Cu, Sn—In, Sn—Ag—In—Bi, Sn—Ag, or Sn—Zn—Al. No content rate is particularly set for metals constituting the solder powder.

The solder powder has a melting point ranging preferably from 100° C. to 240° C., inclusive, more preferably from 130° C. to 240° C., inclusive. Solder powder having a melting point lower than 100° C. weakens solder itself, possibly not giving sufficient strength even when the solder powder is melted and integrated. Solder powder having a melting point higher than 240° C. highly possibly allows a current thermosetting resin binder to inhibit self-aggregation of the solder powder in soldering, because no thermosetting resin binder has not been discovered so far that starts a curing reaction at a temperature higher than 240° C.

As described above, the solder powder may be powder of Sn—Ag—Cu solder. The Sn—Ag—Cu solder has a melting point ranging from 218° C. to 219° C. The Sn—Ag—Cu solder thus has disadvantages of a high melting point and poor wettability but has an advantage of high reliability. Although the powder of the Sn—Ag—Cu solder has such disadvantages described above, the powder of the Sn—Ag—Cu solder can overcome the disadvantages while still giving the advantage of high reliability, when used as the solder powder in the paste thermosetting resin composition according to the present exemplary embodiment.

As described above, the solder powder may also be powder of Sn—Bi solder. The Sn—Bi solder has a melting point ranging from 138° C. to 139° C. The Sn—Bi solder thus has advantages of a low melting point and excellent wettability, and use of the Sn—Bi solder as the solder powder in the paste thermosetting resin composition according to the present exemplary embodiment exactly gives the advantages described above.

The solder powder has an average particle size ranging preferably from 3 µm to 30 µm, inclusive, more preferably from 10 µm to 25 µm, inclusive. Here, the average particle size means a particle size at a cumulative value of 50% in a particle size distribution derived by a laser diffraction scattering method. The solder powder having an average particle size of 3 µm or more can suppress an excessive rise in viscosity and thixotropy of the paste thermosetting resin composition. The solder powder having an average particle size of 30 µm or less enables easy fine pitch printing. The particle size distribution of the solder powder is appropriately determined according to use application of the paste thermosetting resin composition. For example, the solder powder having a comparatively wide particle size distribution is preferably used for printing, putting priority on printability, while the solder powder having a comparatively narrow particle size distribution is preferably used for dispensing, to be suited for a diameter of a nozzle.

A content of the solder powder ranges preferably from 20% by mass to 90% by mass, inclusive, more preferably from 40% by mass to 85% by mass, inclusive, relative to a total mass of the paste thermosetting resin composition. With the content of the solder powder being 20% by mass or more, the self-aggregation of the solder powder is unlikely to be inhibited during melting, or a decrease in electrical conductivity can be suppressed in solder that has been solidified. With the content of the solder powder being 90% by mass or less, the thermosetting resin composition can be made into a paste.
(Thermosetting Resin Binder)

The thermosetting resin binder is something into which the solder powder is kneaded to make the solder powder into a viscous paste and which puts particles of the solder powder together. Such a thermosetting resin binder contains a main agent and a curing agent. Hereinafter, described are the main agent and the curing agent.
<Main Agent>

The main agent contains a di- or higher functional oxetane compound. The di- or higher functional oxetane compound is a compound having two or more oxetane rings. Each of the oxetane rings is a saturated 4-membered ring having one oxygen atom. Hereinafter, the simple term oxetane compound means the di- or higher functional oxetane compound unless otherwise specified. A curing reaction proceeds by ring-opening and cross-linking of the 4-membered rings of the oxetane compound. A 4-membered ring is lower in ring-opening speed than a 3-membered ring, so that a main agent having a 4-membered ring can slow speed of a curing reaction than a main agent having a 3-membered ring. Specifically, there can be exemplified an epoxy compound as a representative example of a compound having a 3-membered ring. Compared with a case of using this epoxy compound as the main agent, using the oxetane compound as the main agent can slow the curing speed of the thermosetting resin binder. Such low curing speed can prevent the thermosetting resin binder from inhibiting the self-aggregation of the solder powder during melting, allowing easy self-aggregation and integration of solder melted. In the meantime, the solder powder that is solid sometimes accounts for a comparatively large percentage of the total mass of the paste thermosetting resin composition. Therefore, in terms of retaining a form of the paste, the oxetane compound is preferably a liquid at normal temperature (for example, from 20° C. to 40° C., inclusive). The main agent may also contain a monofunctional oxetane compound having only one oxetane ring.

The oxetane compound is preferably one or more compounds selected from the group consisting of following formulae (O1) to (O3).

[Chemical 1]

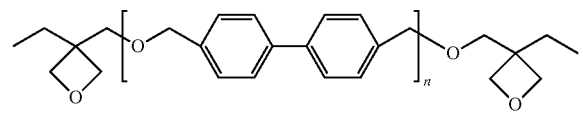

(O1)

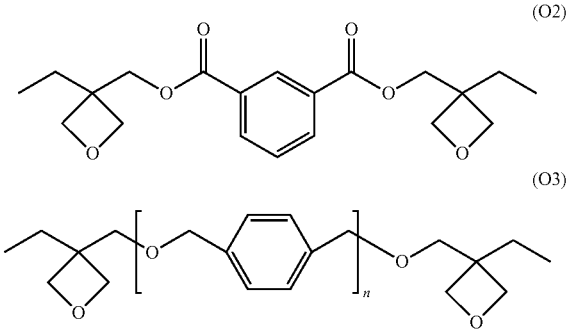

(In both the formulae (O1) and (O3), n is an integer of 1 to 3.)

The oxetane compound represented by the formula (O1) is 4,4'-bis[(3-ethyl-3-oxetanyl)methoxymethyl]biphenyl. The oxetane compound represented by the formula (O1) has a structure (biphenyl skeleton) in which two benzene rings are connected by a single bond, and this biphenyl skeleton is similar to a basic skeleton of bisphenols. Therefore, the oxetane compound represented by the formula (O1) has excellent compatibility with epoxy compounds such as bisphenol F.

The oxetane compound represented by the formula (O2) is bis[(3-ethyloxetane-3-yl)methyl]benzene-1,3-dicarboxylate.

The oxetane compound represented by the formula (O3) is xylylenebisoxetane.

The oxetane compound is preferably 50% by mass or more and may be 100% by mass, relative to a total mass of the main agent. With the oxetane compound accounting for 50% by mass or more, even when the main agent contains a component other than the oxetane compound, the thermosetting resin binder is less likely to be affected by the component other than the oxetane compound to slow the curing speed of the thermosetting resin binder.

The main agent preferably further contains a di- or higher functional epoxy compound. The di- or higher functional epoxy compound is a compound having two or more epoxy groups. The epoxy groups are 3-membered ring ether, or oxacyclopropane (oxirane). Hereinafter, the simple term epoxy compound means a di- or higher functional epoxy compound unless otherwise specified. As described above, the 4-membered ring of the oxetane compound is low in ring-opening speed and the 3-membered ring of the epoxy compound is high in ring-opening speed, in a process of the curing reaction. Therefore, both the oxetane compound and the epoxy compound can be used in combination while amounts of the compounds are adjusted, to adjust, specifically, slow or accelerate the curing speed of the thermosetting resin binder. Further addition of the epoxy compound can eventually suppress generation of an uncured portion of the thermosetting resin binder and can also increase strength of a cured product. When the oxetane compound and the epoxy compound are used in combination, structures of the compounds are preferably similar to each other to increase the compatibility. As described above, the oxetane compound having a biphenyl skeleton has excellent compatibility with epoxy compounds such as bisphenol F, for example.

<Curing Agent>

The curing agent contains a benzoxazine compound having two or more oxazine rings. Each of the oxazine rings is, as shown on a left side of an arrow in a following formula (B0), a 6-membered heterocycle having one oxygen atom and one nitrogen atom. Hereinafter, the simple term benzoxazine compound means a benzoxazine compound having two or more oxazine rings, unless otherwise specified. As shown in the following formula (B0), when the benzoxazine compound is heated to reach approximately 200° C., an —O—CH₂— bond of the oxazine ring is broken to achieve ring-opening, generating a phenolic hydroxy group and a tertiary amine. The tertiary amine thus generated serves as a curing accelerator, making addition of another curing accelerator unnecessary. The phenolic hydroxy group can react with the main agent to promote the curing reaction, increasing cross-linking density of a cured product. Thus, the curing agent containing the benzoxazine compound can raise a curing reaction start temperature because the oxazine rings do not achieve the ring-opening before approximately 200° C. Conventionally, the thermosetting resin binder has had a remarkably lower curing start temperature than the melting point of the solder powder, so that the thermosetting resin binder first starts the curing reaction to inhibit the self-aggregation of the solder powder during melting. With the curing start temperature being approximately 200° C., however, even when the solder powder has a melting point of 240° C., it is possible to prevent the thermosetting resin binder from inhibiting the self-aggregation of the solder powder during melting, allowing easy self-aggregation and integration of solder melted. That is, at the time of reaching the melting point of the solder powder, the curing reaction of the thermosetting resin binder has not proceeded as much as the self-aggregation of the solder is inhibited. Further, the curing agent containing the benzoxazine compound is less likely to promote the curing reaction when only mixed with the main agent at normal temperature, to prolong a pot life. Dicyandiamide is known as a general curing agent, which does not, however, singularly promote the curing reaction, to require addition of a curing accelerator. The addition of a curing accelerator to dicyandiamide, however, rapidly promotes the curing reaction, so that it is difficult to obtain the same effect as the benzoxazine compound.

[Chemical 2]

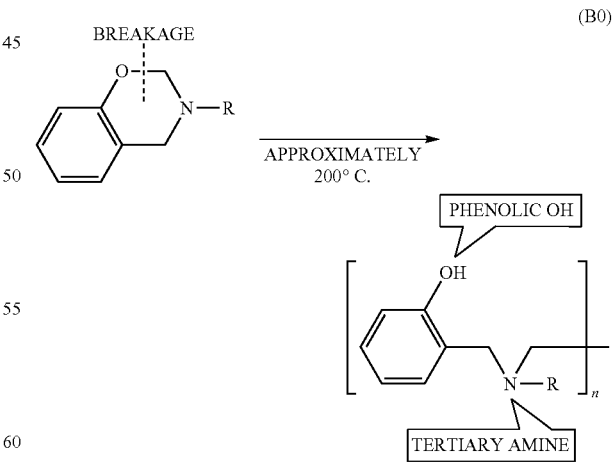

(In the formula (B0), R can be any substituent and n can be any integer.)

The benzoxazine compound is preferably one or more compounds selected from the group consisting of following formulae (B1) to (B3).

[Chemical 3]

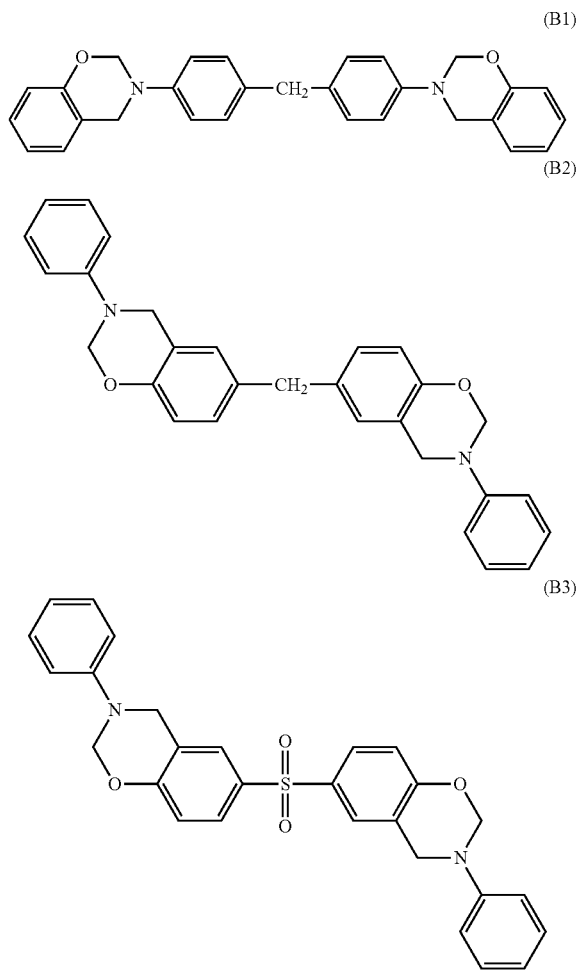

The benzoxazine compound represented by the formula (B1) is a P-d type benzoxazine compound. The benzoxazine compound represented by the formula (B1) does not generate aniline even after the ring-opening of the oxazine rings, so that it is possible to suppress a decrease in moisture resistance of a cured product.

The benzoxazine compound represented by the formula (B2) is a bisphenol F-based benzoxazine compound. The benzoxazine compound represented by the formula (B3) is a bisphenol S-based benzoxazine compound. The benzoxazine compounds represented by the formulae (B2) and (B3) are, in chemical structures, similar to the oxetane compound represented by the formula (O1) and epoxy compounds such as bisphenol F to be excellent in compatibility with these compounds.

The benzoxazine compound preferably ranges from 10 parts by mass to 40 parts by mass, inclusive, relative to 100 parts by mass of the main agent. With the benzoxazine compound being 10 parts by mass or more, it is possible to eventually suppress generation of an uncured portion of the thermosetting resin binder and increase strength of a cured product of the thermosetting resin binder. With the benzoxazine compound being 40 parts by mass or less, rapid curing of the thermosetting resin binder can be suppressed to prevent inhibition of the self-aggregation of the solder powder during melting.

(Activator)

The activator is also referred to as a flux. The activator is a solvent for, particularly during melting of the solder powder, removing an oxide film that covers surfaces of individual particles of the solder powder to suppress oxidation and decreasing surface tension to accelerate wettability of the solder powder. The activator is not particularly limited as long as the activator has such functions. The activator preferably contains one or more compounds selected from the group consisting of glutaric acid and triethanolamine. The activator more preferably contains both glutaric acid and triethanolamine in terms of a synergetic effect. These activators do not decompose and are stable even when the solder powder has a melting point of 240° C., so that the activators can maintain the functions at such a high temperature. Further, these activators are less likely to remain as a modified product (flux residue) after soldering and are also effective to decrease the viscosity of the paste thermosetting resin composition.

(Thixotropy Imparting Agent)

The thixotropy imparting agent is an additive that imparts thixotropy to the paste thermosetting resin composition. The thixotropy is one property that is important during printing with the paste thermosetting resin composition. The paste thermosetting resin composition to which the thixotropy has been imparted can, for example, suppress, after printing by screen printing, generation of stringing when a screen plate is separated from a printed surface. The thixotropy imparting agent is not particularly limited. The thixotropy imparting agent preferably contains amide wax. Specific examples of the amide wax include N-hydroxyethyl-12-hydroxystearyl-amide.

[Method for Manufacturing Paste Thermosetting Resin Composition]

A paste thermosetting resin composition according to the present exemplary embodiment can be manufactured as follows.

First, a thixotropy imparting agent, an oxetane compound as a main agent, and another component as the main agent as necessary (for example, an epoxy compound) are blended and heated to dissolve the thixotropy imparting agent, thus giving a first mixture.

Next, the first mixture is blended with an activator and a curing agent (for example, a benzoxazine compound) and kneaded with a kneader such as a planetary mixer to give a second mixture. When the activator and the curing agent are solid, it is preferred to make the activator and the curing agent pass, for example, a flat woven sieve having an aperture of 125 μm and a wire diameter of 90 μm according to Japanese Industrial Standard (JIS) Number Z 8801, in terms of uniform dispersion.

Last, the second mixture is blended with solder powder and continuously kneaded with the kneader to give the paste thermosetting resin composition.

As described above, the paste thermosetting resin composition according to the present exemplary embodiment contains solder powder, a thermosetting resin binder, an activator, and a thixotropy imparting agent. The solder powder has a melting point ranging from 100° C. to 240° C., inclusive. The thermosetting resin binder contains a main agent and a curing agent. The main agent contains a di- or higher functional oxetane compound.

This can prevent inhibition of melting and aggregation of the solder powder in soldering regardless of a high or low melting point of the solder powder.

The oxetane compound may be one or more compounds selected from the group consisting of following formulae (O1) to (O3).

[Chemical 1]

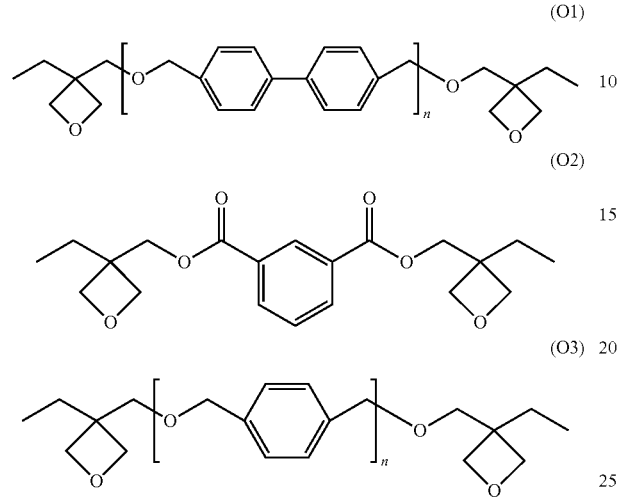

(O1)

(O2)

(O3)

(In both the formulae (O1) and (O3), n is an integer of 1 to 3.)

The oxetane compound may be 50% by mass or more relative to a total mass of the main agent.

The curing agent may contain a benzoxazine compound having two or more oxazine rings.

The solder powder may be powder of Sn—Ag—Cu solder.

The solder powder may also be powder of Sn—Bi solder.

The solder powder may have an average particle size ranging from 3 μm to 30 μm, inclusive.

The main agent may also contain a di- or higher functional epoxy compound.

The activator may contain one or more compounds selected from the group consisting of glutaric acid and triethanolamine.

The thixotropy imparting agent may contain amide wax.

Alternatively, the paste thermosetting resin composition according to the present exemplary embodiment contains solder powder, a thermosetting resin binder, an activator, and a thixotropy imparting agent. The solder powder has a melting point ranging from 100° C. to 240° C., inclusive. The thermosetting resin binder contains a main agent and a curing agent. The curing agent contains a benzoxazine compound having two or more benzoxazine rings.

This can prevent inhibition of melting and aggregation of the solder powder in soldering regardless of a high or low melting point of the solder powder.

The benzoxazine compound may be one or more compounds selected from the group consisting of following formulae (B1) to (B3).

[Chemical 3]

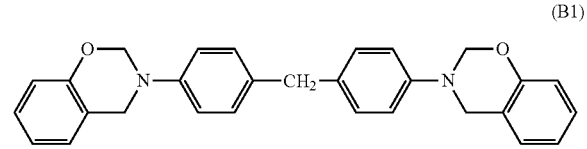

(B1)

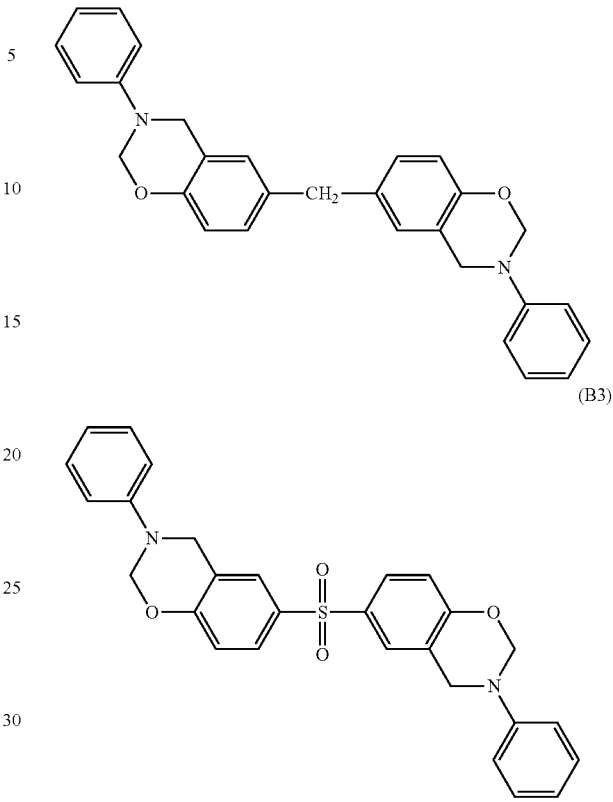

(B2)

(B3)

The benzoxazine compound may range from 10 parts by mass to 40 parts by mass, inclusive, relative to 100 parts by mass of the main agent.

The main agent may contain a di- or higher functional oxetane compound.

Second Exemplary Embodiment

[Semiconductor Component]

FIG. 1 is a schematic sectional view showing semiconductor component 2 according to a second exemplary embodiment of the present invention. Semiconductor component 2 includes semiconductor package 5, first substrate 31, first solder bonding part 41, and first resin reinforcing part 51. Hereinafter, described are these elements constituting semiconductor component 2. In semiconductor component 2, a vertical direction is defined with semiconductor package 5 set as an upper element and first substrate 31 set as a lower element. The definition, however, is no more than a definition for conveniently describing the semiconductor component. Further, ordinal numbers such as "first" are applied to avoid confusion of constitutional elements and do not mean numerical limitation of the elements.

(Semiconductor Package)

Semiconductor package 5 is not particularly limited. Specific examples of semiconductor package 5 include a BGA (ball grid array) and a CSP (chip size package).

(First Substrate)

First substrate 31 is a printed wiring board and is not particularly limited. First pad 21 is formed on an upper surface of first substrate 31. At least one first pad 21 is formed. When semiconductor component 2 is mounted on second substrate 32 described later, first substrate 31 may be an interposer. In this case, it is preferred to form land 61 on a lower surface of first substrate 31 and to form second solder bump 8 on land 61. With such an interposer, or first substrate 31, a wiring pitch of semiconductor package 5 in semiconductor component 2 can be converted into a wiring pitch of second substrate 32.

(First Solder Bonding Part)

First solder bonding part 41 electrically bonds semiconductor package 5 with first pad 21 on the upper surface of first substrate 31.

First solder bonding part 41 has a melting point ranging preferably from 100° C. to 240° C., inclusive, more preferably from 130° C. to 240° C., inclusive. First solder bonding part 41 having a melting point lower than 100° C. weakens solder itself, possibly not giving sufficient strength. First solder bonding part 41 having a melting point higher than 240° C. highly likely allows a first thermosetting resin binder that forms first resin reinforcing part 51 and is described later to inhibit self-aggregation of solder powder in soldering.

First solder bonding part 41 is preferably formed of one or more types of solder selected from the group consisting of Sn—Ag—Cu solder and Sn—Bi solder. Such solder can increase bonding strength of first solder bonding part 41 and suppress generation of defects such as a crack.

(First Resin Reinforcing Part)

First resin reinforcing part 51 is formed in contact with first bonding part 41 and reinforces first solder bonding part 41. First resin reinforcing part 51 is in contact with at least either one of a lower surface of semiconductor package 5 and the upper surface of first substrate 31.

First resin reinforcing part 51 is formed of a cured product of the first thermosetting resin binder. The first thermosetting resin binder is the same as the thermosetting resin binder in the paste thermosetting resin composition according to the first exemplary embodiment. That is, the first thermosetting resin binder contains a di- or higher functional oxetane compound. Therefore, in heating for soldering, curing speed of the first thermosetting resin binder is lower than speed at which the solder powder is melted and integrated. Thus, it is possible to prevent the first thermosetting resin binder from inhibiting the self-aggregation of the solder powder during melting. Melted solder undergoes easy self-aggregation and integration. Thus, first solder bonding part 41 is formed. An aggregation state of the solder powder is excellent in first solder bonding part 41 formed.

The first thermosetting resin binder preferably further contains a benzoxazine compound having two or more oxazine rings. Addition of the benzoxazine compound raises a curing start temperature of the first thermosetting resin binder during heating for soldering. This does not always mean that the first thermosetting resin binder has a curing start temperature higher than a melting point of the solder powder but means that the first thermosetting resin binder has a curing start temperature not excessively lower than the melting point of the solder powder. Depending on a degree of progression of a curing reaction of the first thermosetting resin binder, when the solder powder has a high melting point and the first thermosetting resin binder has a low curing start temperature, a difference between the melting point and the curing start temperature is, as a rough indication, preferably within 40° C. Thus, it is possible to prevent the first thermosetting resin binder from inhibiting the self-aggregation of the solder powder during melting, allowing easy self-aggregation and integration of the solder melted. The aggregation state of the solder powder becomes more excellent in first solder bonding part 41.

The first thermosetting resin binder preferably further contains a di- or higher functional epoxy compound. Addition of the epoxy compound can eventually suppress generation of an uncured portion of the first thermosetting resin binder and increase strength of first resin reinforcing part 51 that is a cured product of the first thermosetting resin binder.

Figure 2A:
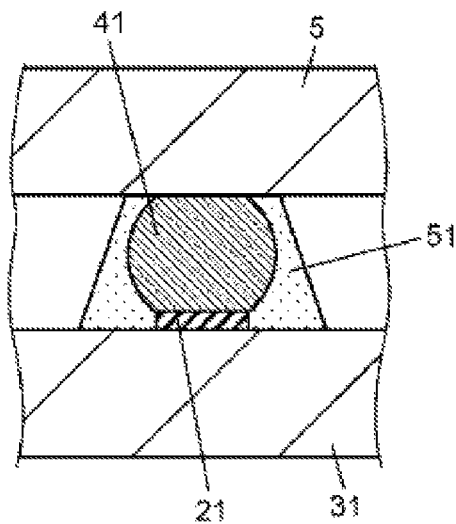
FIG. 2A is a schematic sectional view showing a part of the semiconductor component shown in FIG. 1.

FIG. 2A is a schematic sectional view showing a part of semiconductor component 2 shown in FIG. 1. As shown in FIG. 2A, an entire side surface of first solder bonding part 41 may be covered with first resin reinforcing part 51 so that first solder bonding part 41 is not exteriorly exposed. In this case, first resin reinforcing part 51 is in contact with both the lower surface of semiconductor package 5 and the upper surface of first substrate 31 to improve a reinforcing effect for first solder bonding part 41 by first resin reinforcing part 51.

Figure 2B:
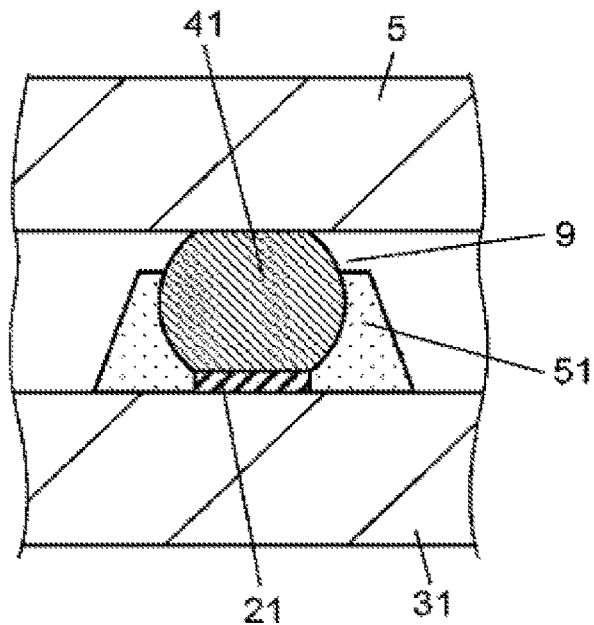
FIG. 2B is a schematic sectional view showing another part of the semiconductor component shown in FIG. 1.

FIG. 2B is a schematic sectional view showing another part of semiconductor component 2 shown in FIG. 1. As shown in FIG. 2B, first resin reinforcing part 51 may be provided with gap 9 so that a part of first solder bonding part 41 is exteriorly exposed. First solder bonding part 41 is remelted to expand when heated to the melting point or higher, so that melted solder has nowhere to go when the entire side surface of first solder bonding part 41 is covered with first resin reinforcing part 51, exploding first resin reinforcing part 51 to possibly generate solder flash or a solder bridge. Even when first solder bonding part 41 is melted, first resin reinforcing part 51 that is provided with gap 9 as shown in FIG. 2B allows an increase in volume of solder to once go out through gap 9. Subsequently, when cooled to lower than the melting point, the solder that has gone out returns to an original place through gap 9 to re-form first solder bonding part 41, suppressing generation of solder flash and a solder bridge. In FIG. 2B, gap 9 is provided so as not to allow first resin reinforcing part 51 to be in contact with the lower surface of semiconductor package 5. A formation location of gap 9, however, is not particularly limited. When first solder bonding part 41 once formed is not reheated to the melting point or higher, first resin reinforcing part 51 is not necessarily provided with gap 9. For example, when secondary mounting is performed after primary mounting, a location of the first mounting can be reheated during the secondary mounting, so that a form shown in FIG. 2 is preferably employed in the primary mounting.

[Method for Manufacturing Semiconductor Component]

A method for manufacturing semiconductor component 2 according to the present exemplary embodiment includes steps A1 to D1. Hereinafter, the steps are sequentially described.

(Step A1)

Figure 3:
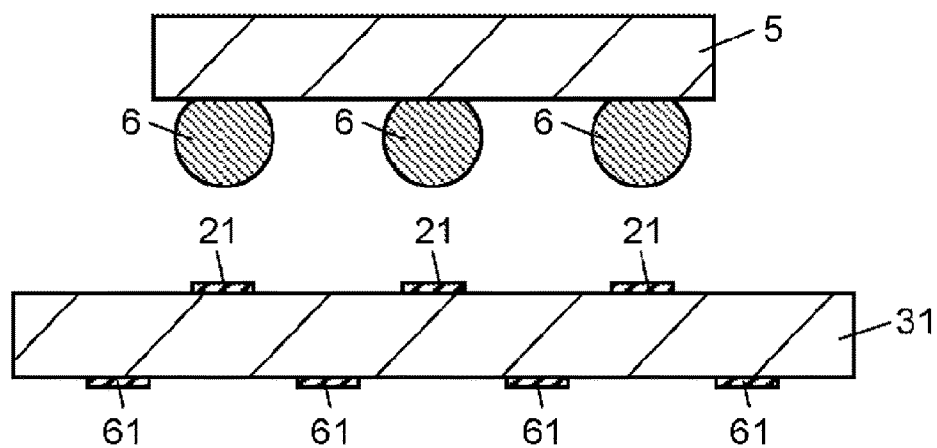
FIG. 3 is a schematic sectional view showing a step A1 of a method for manufacturing the semiconductor component shown in FIG. 1 and a step A2 of the method for manufacturing a semiconductor mounted article.

FIG. 3 is a schematic sectional view showing the step A1 of the method for manufacturing semiconductor component 2 shown in FIG. 1. In the step A1, semiconductor package 5 and first substrate 31 are prepared as shown in FIG. 3.

As described above, semiconductor package 5 is specifically a chip size package (CSP), for example. First solder bump 6 is formed on a lower surface of semiconductor package 5. At least one first solder bump 6 is formed. First solder bump 6 is preferably formed of one or more types of solder selected from the group consisting of Sn—Ag—Cu solder and Sn—Bi solder. Such solder can increase bonding strength of first solder bonding part 41 and suppress generation of defects such as a crack.

First substrate 31 is specifically a printed wiring board as described above. First pad 21 is formed on an upper surface of first substrate 31. First pad 21 is formed as many as first solder bump 6. First solder bump 6 and first pad 21 are formed so as to correspond to each other on a one-to-one basis when the lower surface of semiconductor package 5 is made to face the upper surface of first substrate 31. Land 61 may be formed on a lower surface of first substrate 31. Land 61 can be used for secondary mounting.

(Step B1)

Figure 4:
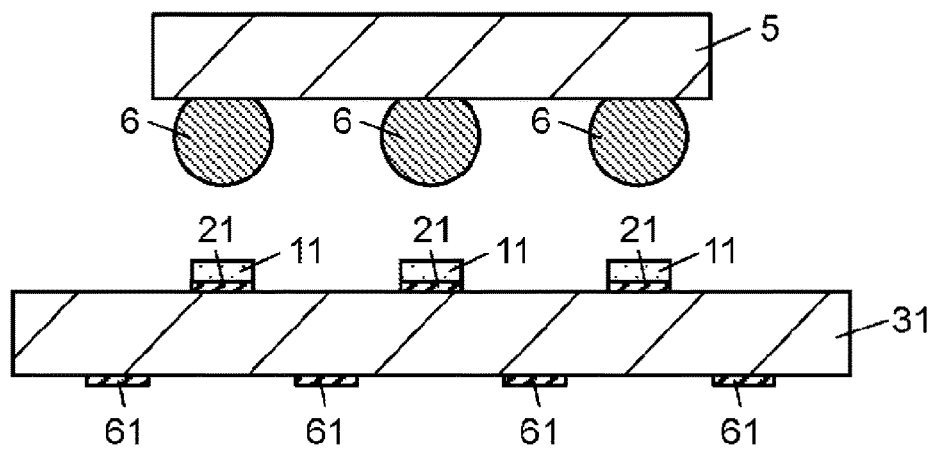
FIG. 4 is a schematic sectional view showing a step B1 of the method for manufacturing the semiconductor component shown in FIG. 1 and a step B2 of the method for manufacturing a semiconductor mounted article.

FIG. 4 is a schematic sectional view showing the step B1 of the method for manufacturing semiconductor component 2 shown in FIG. 1. In the step B1, first paste thermosetting resin composition 11 is applied to first pad 21 of first substrate 31 as shown in FIG. 4. When a plurality of first pads 21 are formed on first substrate 31, first paste thermosetting resin composition 11 is preferably applied to each of first pads 21.

Here, first paste thermosetting resin composition 11 is the same as the paste thermosetting resin according to the first exemplary embodiment. That is, first paste thermosetting resin composition 11 contains solder powder, a first thermosetting resin binder, an activator, and a thixotropy imparting agent. The first thermosetting resin binder contains a main agent and a curing agent. The main agent contains an oxetane compound.

Thus, first paste thermosetting resin composition 11 contains solder powder that has a melting point ranging from 100° C. to 240° C., inclusive, a di- or higher functional oxetane compound, an activator, and a thixotropy imparting agent. Addition of the oxetane compound can slow curing speed of the first thermosetting resin binder. Accordingly, it is possible to prevent the first thermosetting resin binder from inhibiting self-aggregation of the solder powder during melting, allowing easy self-aggregation and integration of solder melted.

The solder powder may be formed of powder of one or more types of solder selected from the group consisting of Sn—Ag—Cu solder and Sn—Bi solder.

First paste thermosetting resin composition 11 preferably further contains a benzoxazine compound having two or more oxazine rings. Addition of the benzoxazine compound can further accelerate the integration through the self-aggregation of the solder melted.

First paste thermosetting resin composition 11 preferably further contains a di- or higher functional epoxy compound. Such further addition of the epoxy compound can eventually suppress generation of an uncured portion of the first thermosetting resin binder and increase strength of a cured product.

A method for applying first paste thermosetting resin composition 11 to first pad 21 of first substrate 31 is not particularly limited. Specific examples of the application method include screen printing and a dispensing method.

(Step C1)

Figure 5:
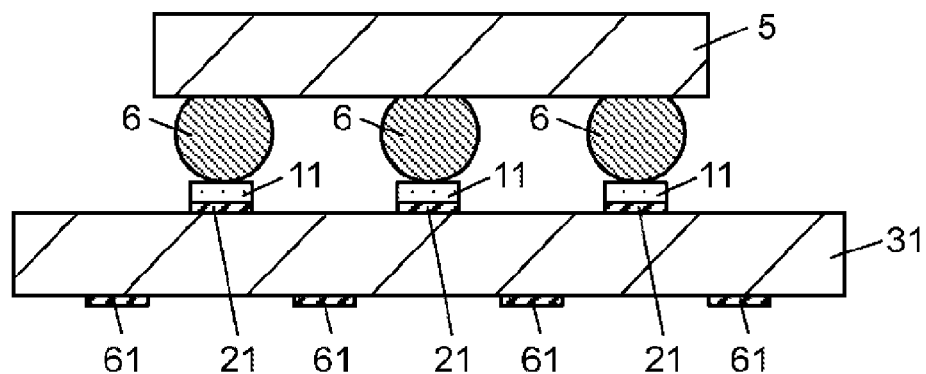
FIG. 5 is a schematic sectional view showing steps C1 and D1 of the method for manufacturing the semiconductor component shown in FIG. 1 and steps C2 and D2 of the method for manufacturing a semiconductor mounted article.

FIG. 5 is a schematic sectional view showing the steps C1 and D1 of the method for manufacturing semiconductor component 2 shown in FIG. 1. In the step C1, first solder bump 6 of semiconductor package 5 is disposed on first pad 21 of first substrate 31 as shown in FIG. 5. In the disposition, first paste thermosetting resin composition 11 is interposed between first solder bump 6 and first pad 21.

(Step D1)

Figure 6A:
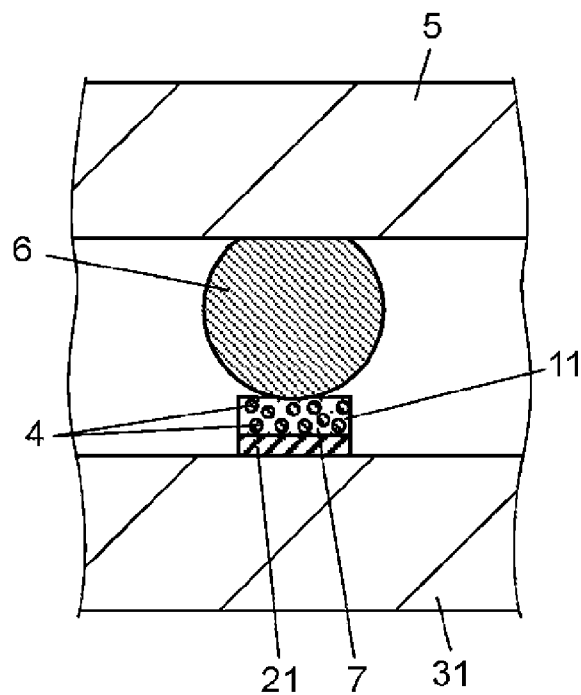
FIG. 6A is an enlarged schematic sectional view of a part in FIG. 5.

In the step D1, reflow soldering is performed by heating semiconductor package 5 and first substrate 31 in a state shown in FIG. 5 for 4 minutes or more in such a manner that a peak temperature ranges from 220° C. to 260° C., inclusive. Although an upper limit of a heating period is not particularly limited, the heating period is, for example, 10 minutes and the upper limit of the heating period particularly at the peak temperature is, for example, 1 minute. FIG. 6A is an enlarged schematic sectional view of a part in FIG. 5. First paste thermosetting resin composition 11 containing solder powder 4 and first thermosetting resin binder 7 is applied to first pad 21 and is in contact with first solder bump 6. The activator and the thixotropy imparting agent are not shown in the drawing. The peak temperature is basically set to a temperature 20° C. to 30° C. higher than the melting point of solder powder 4 contained in first paste thermosetting resin composition 11.

Here, depending on materials for first solder bump 6 and solder powder 4, following three cases are assumed: (1) when first solder bump 6 has the same melting point as the melting point of solder powder 4; (2) when first solder bump 6 has a low melting point and solder powder 4 has a high melting point; and (3) first solder bump 6 has a high melting point and solder powder 4 has a low melting point.

Figure 6B:
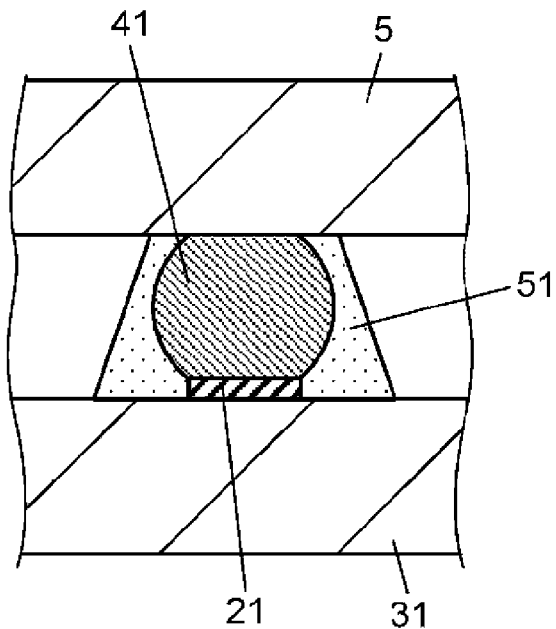
FIG. 6B is a schematic sectional view showing a part of the semiconductor component shown in FIG. 1.

FIG. 6B is a schematic sectional view showing a part of semiconductor component 2 shown in FIG. 1. In the cases (1) and (2), when the peak temperature is set to a temperature 20° C. to 30° C. higher than the melting point of solder powder 4, first solder bump 6 can also be melted. Thus, both first solder bump 6 and solder powder 4 are melted, mixed, and integrated to form, from a state shown in FIG. 6A, strong first solder bonding part 41 as shown in FIG. 6B. Further, since first paste thermosetting resin composition 11 contains the oxetane compound, it is possible to prevent inhibition of the self-aggregation of first solder bump 6 and solder powder 4 during melting, allowing easy self-aggregation and integration of solder melted.

Figure 6C:
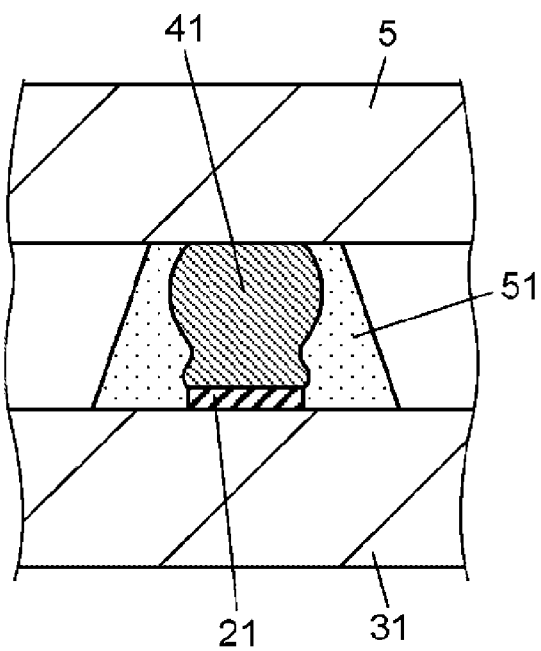
FIG. 6C is a schematic sectional view showing another part of the semiconductor component shown in FIG. 1.

FIG. 6C is a schematic sectional view showing another part of semiconductor component 2 shown in FIG. 1. In the case (3), even when the peak temperature is set to a temperature 20° C. to 30° C. higher than the melting point of solder powder 4, first solder bump 6 is not melted in some cases. One example of this case is a case in which first solder bump 6 is formed of Sn—Ag—Cu solder (melting point 218° C. to 219° C.) and solder powder 4 is powder of Sn—Bi solder (melting point 138° C. to 139° C.). In this case, even when the peak temperature is set to 160° C., first solder bump 6 is not melted. Thus, only solder powder 4 is melted to form, from the state shown in FIG. 6A, first solder bonding part 41 having a constricted part as shown in FIG. 6C. This constricted part includes an interface between first solder bump 6 and solder formed by melting and subsequent integration of solder powder 4. First solder bonding part 41 shown in FIG. 6C is, due to the constricted part, weaker in strength than first solder bonding part 41 shown in FIG. 6B. However, no problem is particularly found in overall reliability due to reinforcement by first resin reinforcing part 51. In the case (3), the peak temperature is preferably set to a temperature 20° C. to 30° C. higher than the melting point of first solder bump 6. Such setting can melt both first solder bump 6 and solder powder 4 to form strong first solder bonding part 41 shown in FIG. 6B. For example, when first solder bump 6 is formed of Sn—Ag—Cu solder (melting point 218° C. to 219° C.) and solder powder 4 is powder of Sn—Bi solder (melting point 138° C. to 139° C.), the peak temperature may be set to 240° C. Since first paste thermosetting resin composition 11 contains the oxetane compound, it is possible to prevent inhibition of the self-aggregation of solder powder 4 during melting when the peak temperature is the melting point of solder powder 4 or higher. Thus, melted solder undergoes easy self-aggregation and integration. As described above, the peak temperature is preferably set to a temperature 20° C. to 30° C. higher than the melting point of first solder bump 6. Such setting can melt both first solder bump 6 and solder powder 4 to prevent inhibition of the self-aggregation of first solder bump 6 and solder powder 4 during melting. Thus, melted solder can undergo easy self-aggregation and integration to form strong first solder bonding part 41 having no constricted part.

A temperature rise rate to reach the peak temperature preferably ranges from 1° C./s to 4° C./s, inclusive. A temperature rise rate of 1° C./s or more can suppress an increase in viscosity of the first paste thermosetting resin composition, which is caused by progression of a curing reaction of first thermosetting resin binder 7 before the temperature reaches the melting point of solder powder 4. This can further accelerate the integration through the self-aggregation of the solder melted. A temperature rise rate of 4° C./s or less enables securement of sufficient time for removing an oxide film of solder powder 4 through a reduction action of the activator. This can further accelerate wettability of the solder. Although a heating start temperature is usually normal temperature, the heating start temperature is not particularly limited.

After completion of the reflow soldering, semiconductor component 2 as shown in FIG. 1 can be obtained. Second solder bump 8 is formed on land 61 of the lower surface of first substrate 31 in semiconductor component 2. Land 61 and second solder bump 8, however, are unnecessary when secondary mounting is not performed. Neither the activator nor the thixotropy imparting agent is preferably left in first resin reinforcing part 51. Small amounts of the activator and the thixotropy imparting agent, however, may be left as long as the amounts do not impair reliability. Accordingly, it is unnecessary to remove the activator and the thixotropy imparting agent through washing.

As described above, in the present exemplary embodiment, since first paste thermosetting resin composition 11 contains the oxetane compound, it is possible to prevent inhibition of melting and aggregation of solder powder 4 in soldering regardless of a high or low melting point of solder powder 4.

[Semiconductor Mounted Article]

Figure 7:
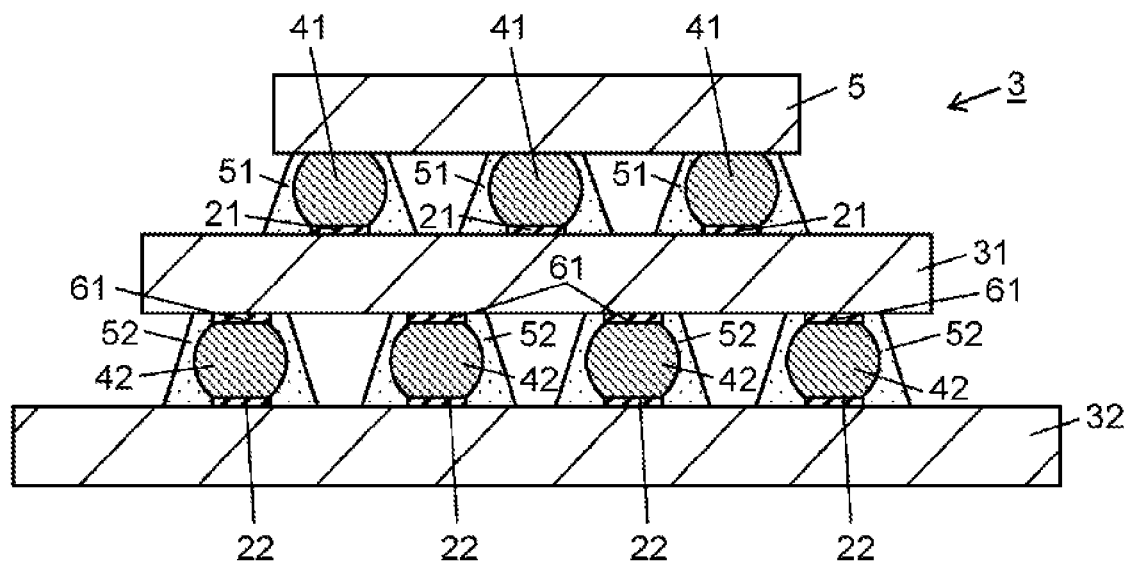
FIG. 7 is a schematic sectional view showing a semiconductor mounted article according to the second exemplary embodiment of the present invention.

FIG. 7 is a schematic sectional view showing semiconductor mounted article 3 according to the second exemplary embodiment of the present invention. Semiconductor mounted article 3 includes semiconductor package 5, first substrate 31, first solder bonding part 41, first resin reinforcing part 51, second substrate 32, second solder bonding part 42, and second resin reinforcing part 52. Described are these elements constituting semiconductor mounted article 3. In semiconductor mounted article 3, a vertical direction is defined with semiconductor package 5 set as an upper element and second substrate 32 set as a lower element. The definition, however, is no more than a definition for conveniently describing the semiconductor mounted article. Further, ordinal numbers such as "first" are applied to avoid confusion of constitutional elements and do not mean numerical limitation of the elements.

(Semiconductor Package)

Semiconductor package 5 is not particularly limited. Specific examples of semiconductor package 5 include a BGA and a CSP.

(First Substrate and Second Substrate)

First substrate 31 and second substrate 32 are printed wiring boards and are not particularly limited. First pad 21 is formed on an upper surface of first substrate 31. At least one first pad 21 is formed. Land 61 is formed on a lower surface of first substrate 31. At least one land 61 is formed. First substrate 31 that functions as an interposer can convert a wiring pitch of semiconductor package 5 into a wiring pitch of second substrate 32. Second pad 22 is formed on an upper surface of second substrate 32. Second pad 22 is formed as many as land 61 of first substrate 31. Second substrate 32 can become a mother board or a main board.

(First Solder Bonding Part and Second Solder Bonding Part)

First solder bonding part 41 electrically bonds semiconductor package 5 with first pad 21 on the upper surface of first substrate 31.

Second solder bonding part 42 electrically bonds land 61 on the lower surface of first substrate 31 with second pad 22 on the upper surface of second substrate 32.

First solder bonding part 41 and second solder bonding part 42 have a melting point ranging preferably from 100° C. to 240° C., inclusive, more preferably from 130° C. to 240° C., inclusive. First solder bonding part 41 and second solder bonding part 42 that have a melting point lower than 100° C. weaken solder itself, possibly not giving sufficient strength. First solder bonding part 41 and second solder bonding part 42 that have a melting point higher than 240° C. highly likely allow a first thermosetting resin binder that forms first resin reinforcing part 51 and is described later and a second thermosetting resin binder that forms second resin reinforcing part 52 and is described later, to inhibit self-aggregation of solder powder in soldering.

First solder bonding part 41 and second solder bonding part 42 are preferably formed of one or more types of solder selected from the group consisting of Sn—Ag—Cu solder and Sn—Bi solder. Such solder can increase bonding strength of first solder bonding part 41 and second solder bonding part 42 and suppress generation of defects such as a crack.

(First Resin Reinforcing Part and Second Resin Reinforcing Part)

First resin reinforcing part 51 is formed in contact with first solder bonding part 41 and reinforces first solder bonding part 41. First resin reinforcing part 51 is in contact with at least either one of a lower surface of semiconductor package 5 and the upper surface of first substrate 31.

Second resin reinforcing part 52 is formed in contact with second solder bonding part 42 and reinforces second solder bonding part 42. Second resin reinforcing part 52 is in contact with at least either one of the lower surface of first substrate 31 and the upper surface of second substrate 32.

First resin reinforcing part 51 is formed of a cured product of the first thermosetting resin binder. Second resin reinforcing part 52 is formed of a cured product of the second thermosetting resin binder. The first thermosetting resin binder and the second thermosetting resin binder are the same as the thermosetting resin binder in the paste thermosetting resin composition described above. That is, the first thermosetting resin binder and the second thermosetting resin binder each contain a di- or higher functional oxetane compound. Therefore, in heating for soldering, curing speed of the first thermosetting resin binder and the second thermosetting resin binder is lower than speed at which the solder powder is melted and integrated. Thus, it is possible to prevent the first thermosetting resin binder and the second thermosetting resin binder from inhibiting the self-aggregation of the solder powder during melting. Melted solder undergoes easy self-aggregation and integration. An aggregation state of the solder powder is excellent in first solder bonding part 41 and second solder bonding part 42. Specific types and contents of constitutional components may be the same or different between the first thermosetting resin binder and the second thermosetting resin binder.

One of or both the first thermosetting resin binder and the second thermosetting resin binder preferably further contain a benzoxazine compound having two or more oxazine rings. Addition of the benzoxazine compound to one of or both the first thermosetting resin binder and the second thermosetting resin binder raises a curing start temperature of one of or both the first thermosetting resin binder and the second thermosetting resin binder during heating for soldering. This does not always mean, in a case of, for example, the first thermosetting resin binder containing the benzoxazine compound, that the first thermosetting resin binder has a curing start temperature higher than a melting point of the solder powder, but means that first thermosetting resin binder 7 has a curing start temperature not excessively lower than the melting point of the solder powder. Depending on a degree of progression of a curing reaction of the first thermosetting resin binder, when the solder powder has a high melting point and the first thermosetting resin binder has a low curing start temperature, a difference between the melting point and the curing start temperature is, as a rough indication, preferably within 40° C. The same applies to a case of the second thermosetting resin binder containing the benzoxazine compound. Thus, it is possible to further increase an effect of suppressing inhibition of the self-aggregation of the solder powder during melting, allowing easy self-aggregation and integration of solder melted. The aggregation state of the solder powder becomes more excellent in first solder bonding part 41 and second solder bonding part 42.

One of or both the first thermosetting resin binder and the second thermosetting resin binder preferably further contain a di- or higher functional epoxy compound. The first thermosetting resin binder containing the epoxy compound can eventually suppress generation of an uncured portion of the first thermosetting resin binder and increase strength of first resin reinforcing part 51 that is a cured product of the first thermosetting resin binder. In the same manner, the second thermosetting resin binder containing the epoxy compound can eventually suppress generation of an uncured portion of the second thermosetting resin binder and increase strength of second resin reinforcing part 52 that is a cured product of the second thermosetting resin binder.

In the same manner as in FIG. 2A, an entire side surface of first solder bonding part 41 may be covered with first resin reinforcing part 51 so that first solder bonding part 41 is not exteriorly exposed. In this case, first resin reinforcing part 51 is in contact with the lower surface of semiconductor package 5 and the upper surface of first substrate 31 to improve a reinforcing effect for first solder bonding part 41 by first resin reinforcing part 51. The same manner as in first resin reinforcing part 51 applies to second resin reinforcing part 52.

In the same manner as in FIG. 2B, first resin reinforcing part 51 may be provided with gap 9 so that a part of first solder bonding part 41 is exteriorly exposed. When first solder bonding part 41 is melted to increase in volume, an increase of solder once goes out through gap 9, and then returns to an original place repassing through gap 9 at a temperature lower than the melting point of first solder bonding part 41, to suppress generation of solder flash and a solder bridge. The same manner as in first resin reinforcing part 51 applies to second resin reinforcing part 52. When second solder bonding part 42 is not reheated to the melting point or higher, not a form shown in FIG. 2B but a form shown in FIG. 2A is preferably employed for second solder bonding part 42.

[Method for Manufacturing Semiconductor Mounted Article]

A method for manufacturing semiconductor mounted article 3 according to the present exemplary embodiment includes steps A2 to H2. Hereinafter, the steps are sequentially described.

(Step A2)

FIG. 3 is a schematic sectional view showing the step A2 of the method for manufacturing semiconductor mounted article 3 shown in FIG. 1. As shown in FIG. 3, the step A2 is almost the same as the step A1 of the method for manufacturing semiconductor component 2 described above. For performing secondary mounting, however, land 61 is formed on a lower surface of first substrate 31. At least one land 61 is formed.

(Step B2)

FIG. 4 is a schematic sectional view showing the step B2 of the method for manufacturing semiconductor mounted article 3 shown in FIG. 1. As shown in FIG. 4, the step B2 is the same as the step B1 of the method for manufacturing semiconductor component 2 described above.

(Steps C2 and D2)

FIG. 5 is a schematic sectional view showing the steps C2 and D2 of the method for manufacturing semiconductor mounted article 3 shown in FIG. 1. As shown in FIG. 5, the steps C2 and D2 are the same as the steps C1 and D1 of the method for manufacturing semiconductor component 2 described above. The steps A2 to D2 are steps for primary mounting, and completion of the step D2 completes the primary mounting. Semiconductor component 2 described earlier is obtained after the primary mounting.

(Step E2)

In the step E2, second solder bump 8 is formed on land 61 of the lower surface of first substrate 31 as shown in FIG. 1. When a plurality of lands 61 are formed on first substrate 31, second solder bump 8 is formed for each of lands 61. Second solder bump 8 is preferably formed of one or more types of solder selected from the group consisting of Sn—Ag—Cu solder and Sn—Bi solder. Such solder can increase bonding strength of second solder bonding part 42 and suppress generation of defects such as a crack.

(Step F2)

Figure 8:
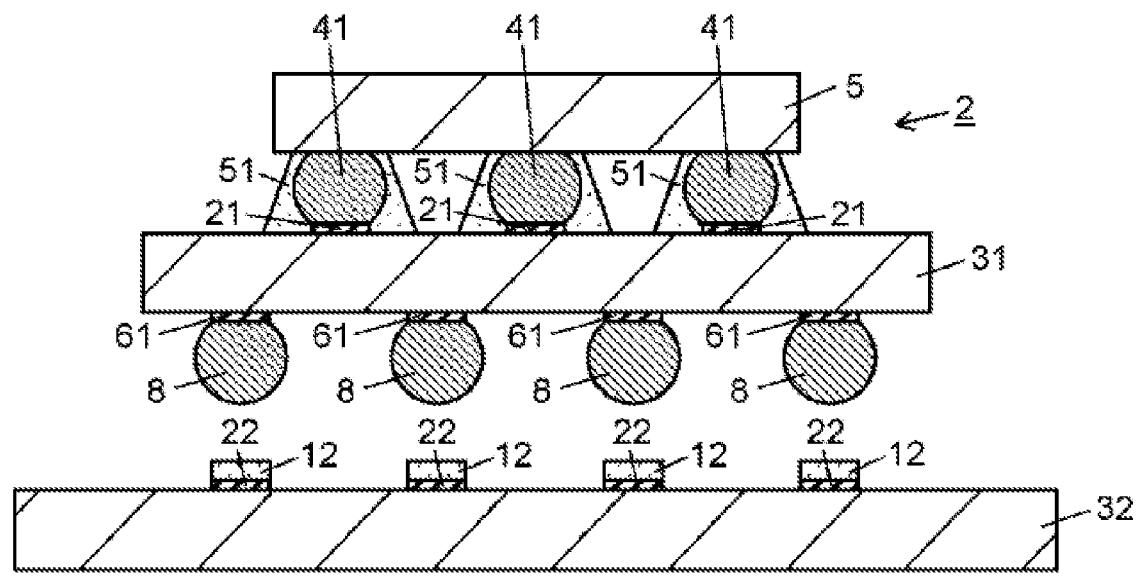
FIG. 8 is a schematic sectional view showing a step F2 of the method for manufacturing the semiconductor mounted article shown in FIG. 7.

FIG. 8 is a schematic sectional view showing the step F2 of the method for manufacturing semiconductor mounted article 3 shown in FIG. 7. In the step F2, second substrate 32 is prepared as shown in FIG. 8. Second substrate 32 is specifically a printed wiring board as described above. Second pad 22 is formed on an upper surface of second substrate 32. Second pad 22 is formed as many as second solder bump 8. Second solder bump 8 and second pad 22 are formed so as to correspond to each other on a one-to-one basis when the lower surface of first substrate 31 is made to face the upper surface of second substrate 32.

Further in the step F2, second paste thermosetting resin composition 12 is applied to second pad 22 of second substrate 32. When a plurality of second pads 22 are formed on second substrate 32, second paste thermosetting resin composition 12 is preferably applied to each of second pads 22.

Here, second paste thermosetting resin composition 12 is the same as the paste thermosetting resin described above. That is, second paste thermosetting resin composition 12 contains solder powder, a second thermosetting resin binder, an activator, and a thixotropy imparting agent. The second thermosetting resin binder contains a main agent and a curing agent. The main agent contains an oxetane compound.

Thus, second paste thermosetting resin composition 12 contains solder powder that has a melting point ranging from 100° C. to 240° C., inclusive, a di- or higher functional oxetane compound, an activator, and a thixotropy imparting agent. Addition of the oxetane compound can slow curing speed of the second thermosetting resin binder. Accordingly, it is possible to prevent the second thermosetting resin binder from inhibiting self-aggregation of the solder powder during melting, allowing easy self-aggregation and integration of solder melted. Specific types and contents of constitutional components may be the same or different between first paste thermosetting resin composition 11 and second paste thermosetting resin composition 12.

The solder powder may be formed of powder of one or more types of solder selected from the group consisting of Sn—Ag—Cu solder and Sn—Bi solder.

Second paste thermosetting resin composition 12 preferably further contains a benzoxazine compound having two or more oxazine rings. This can further accelerate the integration through the self-aggregation of the solder melted.

Second paste thermosetting resin composition 11 preferably further contains a di- or higher functional epoxy compound. Such further addition of the epoxy compound can eventually suppress generation of an uncured portion of the second thermosetting resin binder and increase strength of a cured product.

A method for applying second paste thermosetting resin composition 12 to second pad 22 of second substrate 32 is not particularly limited. Specific examples of the application method include screen printing and a dispensing method.
(Step G2)

Figure 9:
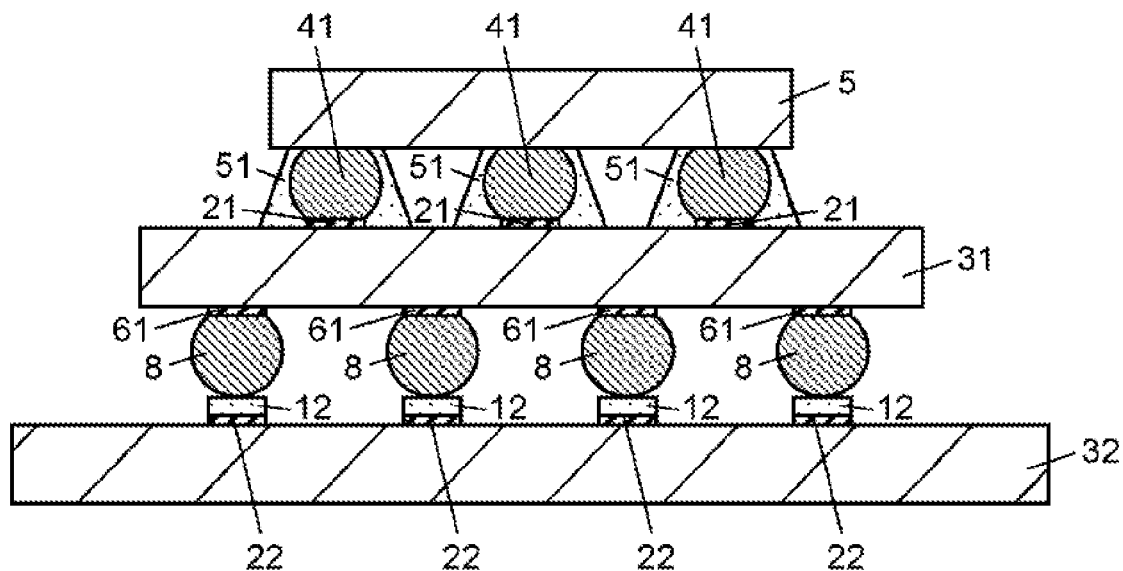
FIG. 9 is a schematic sectional view showing steps G2 and H2 of the method for manufacturing the semiconductor mounted article shown in FIG. 7.

FIG. 9 is a schematic sectional view showing the steps G2 and H2 of the method for manufacturing semiconductor mounted article 3 shown in FIG. 7. In the step G2, second solder bump 8 of first substrate 31 is disposed on second pad 22 of second substrate 32 as shown in FIG. 9. In the disposition, second paste thermosetting resin composition 12 is interposed between second solder bump 8 and second pad 22.
(Step 112)

In the step H2, reflow soldering is performed by heating semiconductor package 5, first substrate 31, and second substrate 32 in a state shown in FIG. 9 for 4 minutes or more in such a manner that a peak temperature ranges from 220° C. to 260° C., inclusive. Although an upper limit of a heating period is not particularly limited, the heating period is, for example, 10 minutes and the upper limit of the heating period particularly at the peak temperature is, for example, 1 minute. The peak temperature is basically set to a temperature 20° C. to 30° C. higher than the melting point of the solder powder contained in second paste thermosetting resin composition 12.

Here, depending on materials for second solder bump 8 and the solder powder, following three cases are assumed: (1) when second solder bump 8 has the same melting point as the melting point of the solder powder; (2) when second solder bump 8 has a low melting point and the solder powder has a high melting point; and (3) second solder bump 8 has a high melting point and the solder powder has a low melting point.

In the cases (1) and (2), when the peak temperature is set to a temperature 20° C. to 30° C. higher than the melting point of the solder powder, second solder bump 8 can also be melted. Thus, both second solder bump 8 and the solder powder are melted, mixed, and integrated to form strong second solder bonding part 42. Further, since second paste thermosetting resin composition 12 contains the oxetane compound, it is possible to prevent inhibition of the self-aggregation of second solder bump 8 and the solder powder during melting, allowing easy self-aggregation and integration of solder melted.

In the cases (1) and (2), when first solder bonding part 41 that has been formed in the primary mounting has a melting point higher than the melting point of the solder powder in second paste resin composition 12, the peak temperature may be set to a temperature between the melting point of the solder powder (inclusive) and the melting point of first solder bonding part 41. Such a peak temperature does not allow remelting of first solder bonding part 41 in the secondary mounting to further suppress generation of solder flash and a solder bridge.

In the case (3), even when the peak temperature is set to a temperature 20° C. to 30° C. higher than the melting point of the solder powder, second solder bump 8 is not sometimes melted. One example of this case is a case in which second solder bump 8 is formed of Sn—Ag—Cu solder (melting point 218° C. to 219° C.) and the solder powder is powder of Sn—Bi solder (melting point 138° C. to 139° C.). In this case, even when the peak temperature is set to 160° C., second solder bump 8 is not melted. Thus, only the solder powder is melted to form second solder bonding part 42 having a constricted part. This constricted part includes an interface between second solder bump 8 and solder formed by melting and subsequent integration of the solder powder. Second solder bonding part 42 including a constricted part weakens in strength. However, no problem is particularly found in overall reliability due to reinforcement by second resin reinforcing part 52. In the case (3), the peak temperature is preferably set to a temperature 20° C. to 30° C. higher than the melting point of second solder bump 8. Such setting can melt both second solder bump 8 and the solder powder to form strong second solder bonding part 42 having no constricted part. For example, when second solder bump 8 is formed of Sn—Ag—Cu solder (melting point 218° C. to 219° C.) and the solder powder is powder of Sn—Bi solder (melting point 138° C. to 139° C.), as described above, the peak temperature may be set to 240° C. Since second paste thermosetting resin composition 12 contains the oxetane compound, it is possible to prevent inhibition of the self-aggregation of the solder powder during melting when the peak temperature is the melting point of the solder powder or higher. Thus, melted solder undergoes easy self-aggregation and integration. As described above, the peak temperature is preferably set to a temperature 20° C. to 30° C. higher than the melting point of second solder bump 8. Such setting can melt both second solder bump 8 and the solder powder to prevent inhibition of the self-aggregation of second solder bump 8 and the solder powder during melting. Thus, melted solder can undergo easy self-aggregation and integration to form strong second solder bonding part 42 having no constricted part.

In the case (3), when first solder bonding part 41 that has been formed in the primary mounting has a melting point higher than the melting point of second solder bump 8, the peak temperature may be set to a temperature between the melting point of the solder powder (inclusive) (preferably the melting point of second solder bump 8 (inclusive)) and the melting point of first solder bonding part 41. Such a peak temperature does not allow remelting of first solder bonding part 41 in the secondary mounting to further suppress generation of solder flash and a solder bridge.

A temperature rise rate to reach the peak temperature preferably ranges from 1° C./s to 4° C./s, inclusive. A temperature rise rate of 1° C./s or more can suppress an increase in viscosity of the second paste thermosetting resin composition, which is caused by progression of a curing reaction of the second thermosetting resin binder before the temperature reaches the melting point of the solder powder. This can further accelerate the integration through the self-aggregation of the solder melted. A temperature rise rate of 4° C./s or less enables securement of sufficient time for removing an oxide film of the solder powder through a reduction action of the activator. This can further accelerate wettability of the solder. Although a heating start temperature is usually normal temperature, the heating start temperature is not particularly limited.

After completion of the reflow soldering, semiconductor mounted article 3 as shown in FIG. 7 can be obtained. That is, the steps E2 to H2 are steps for the secondary mounting, and completion of the step H2 completes the secondary mounting. Semiconductor mounted article 3 described earlier is obtained after the secondary mounting. Neither the activator nor the thixotropy imparting agent is preferably left in second resin reinforcing part 52. Small amounts of the activator and the thixotropy imparting agent, however, may be left as long as the amounts do not impair reliability. Accordingly, it is unnecessary to remove the activator and the thixotropy imparting agent through washing.

As described above, in the present exemplary embodiment, since second paste thermosetting resin composition 12 contains the oxetane compound, it is possible to prevent inhibition of melting and aggregation of the solder powder in soldering regardless of a high or low melting point of the solder powder.

As described above, semiconductor component 2 according to the present exemplary embodiment includes semiconductor package 5, first substrate 31 whose first surface corresponds to an upper surface and on the first surface of which first pad 21 is formed, first solder bonding part 41 that electrically connects semiconductor package 5 with first pad 21, and first resin reinforcing part 51 that is formed in contact with first solder bonding part 41 and reinforces first solder bonding part 41. First resin 51 is formed of a cured product of a first thermosetting resin binder containing a di- or higher functional oxetane compound.

This makes an aggregation state of the solder powder excellent.

The first thermosetting resin binder may also contain a benzoxazine compound having two or more oxazine rings.

First solder bonding part 41 may have a melting point ranging from 100° C. to 240° C., inclusive.

First solder bonding part 41 may be formed of one or more types of solder selected from the group consisting of Sn—Ag—Cu solder and Sn—Bi solder.

The first thermosetting resin binder may also contain a di- or higher functional epoxy compound.

Semiconductor mounted article 3 according to the present exemplary embodiment includes semiconductor package 5, first substrate 31 whose first surface corresponds to an upper surface, on which first pad 21 is formed, and whose second surface corresponds to a lower surface opposite from the first surface, on which land 61 is formed, and first solder bonding part 41 that electrically connects semiconductor package 5 with first pad 21. Semiconductor mounted article 3 also includes first resin reinforcing part 51 that is formed in contact with first solder bonding part 41 and reinforces first solder bonding part 41, and second substrate 32 whose one surface corresponds to an upper surface and on the one surface of which second pad 22 is formed. Semiconductor mounted article 3 also includes second solder bonding part 42 that electrically connects land 61 with second pad 22, and second resin reinforcing part 52 that is formed in contact with second solder bonding part 42 and reinforces second solder bonding part 42. This makes an aggregation state of the solder powder excellent.

One of or both the first thermosetting resin binder and the second thermosetting resin binder may also contain a benzoxazine compound having two or more oxazine rings.

First solder bonding part 41 and second solder bonding part 42 may have a melting point ranging from 100° C. to 240° C., inclusive.

First solder bonding part 41 and second solder bonding part 42 may be formed of one or more types of solder selected from the group consisting of Sn—Ag—Cu solder and Sn—Bi solder.

One of or both the first thermosetting resin binder and the second thermosetting resin binder may also contain a di- or higher functional epoxy compound.

A method for manufacturing semiconductor component 2 according to the present exemplary embodiment includes following steps A1 to D1. Step A1; preparing semiconductor package 5 whose second surface corresponds to a lower surface and on the second surface of which first solder bump 6 is formed and first substrate 31 whose first surface corresponds to an upper surface opposite to the second surface and on the first surface of which first pad 21 is formed; step B1; printing on first pad 21 a first paste thermosetting resin composition containing solder powder that has a melting point ranging from 100° C. to 240° C., inclusive, a di- or higher functional oxetane compound, an activator, and a thixotropy imparting agent; step C1: disposing first solder bump 6 on first pad 21; and step D1; performing reflow soldering by heating semiconductor package 5 and first substrate 31 for 4 minutes or more in such a manner that a peak temperature ranges from 220° C. to 260° C., inclusive. This makes an aggregation state of the solder powder excellent.

The first paste thermosetting resin composition may also contain a benzoxazine compound having two or more oxazine rings.

First solder bump 6 may be formed of one or more types of solder selected from the group consisting of Sn—Ag—Cu solder and Sn—Bi solder.

The solder powder may be formed of powder of one or more types of solder selected from the group consisting of Sn—Ag—Cu solder and Sn—Bi solder.

The first paste thermosetting resin composition may also contain a di- or higher functional epoxy compound.

A temperature rise rate to reach the peak temperature may range from 1° C./s to 4° C./s, inclusive.

A method for manufacturing semiconductor mounted article 3 according to the present exemplary embodiment includes following steps A2 to H2. Step A2: preparing semiconductor package 5 whose one surface corresponds to a lower surface and on the one surface of which first solder bump 6 is formed, first substrate 31 whose first surface corresponds to an upper surface, on the first surface of which first pad 21 is formed, whose second surface corresponds to a lower surface opposite from the first surface, and on the second surface of which land 61 is formed, and second substrate 32 whose one surface corresponds to an upper surface and on the one surface of which second pad 22 is formed; step B2: printing on first pad 21 a first paste thermosetting resin composition containing solder powder that has a melting point ranging from 100° C. to 240° C., inclusive, a di- or higher functional oxetane compound, an activator, and a thixotropy imparting agent; step C2: disposing first solder bump 6 on first pad 21; step D2: performing reflow soldering by heating semiconductor package 5 and the first substrate for 4 minutes or more in such a manner that a peak temperature ranges from 220° C. to 260° C., inclusive; step E2: forming second solder bump 8 on land 61; step F2: printing on second pad 22 a second paste thermosetting resin composition containing solder powder that has a melting point ranging from 100° C. to 240° C., inclusive, a di- or higher functional oxetane compound, an activator, and a thixotropy imparting agent; step G2: disposing second solder bump 8 on second pad 22; and step H2: performing reflow soldering by heating semiconductor package 5, first substrate 31, and second substrate 32 for 4 minutes or more in such a manner that a peak temperature ranges from 220° C. to 260° C., inclusive. This makes an aggregation state of the solder powder excellent.

One of or both the first paste thermosetting resin composition and the second paste thermosetting resin composition may also contain a benzoxazine compound having two or more oxazine rings.

One of or both first solder bump 6 and second solder bump 8 may be formed of one or more types of solder selected from the group consisting of Sn—Ag—Cu solder and Sn—Bi solder.

The solder powder may be formed of powder of one or more types of solder selected from the group consisting of Sn—Ag—Cu solder and Sn—Bi solder.

One of or both the first paste thermosetting resin composition and the second paste thermosetting resin composition may also contain a di- or higher functional epoxy compound.

A temperature rise rate to reach the peak temperature may range from 1° C./s to 4° C./s, inclusive.

Third Exemplary Embodiment

[Semiconductor Component]

Figure 10:
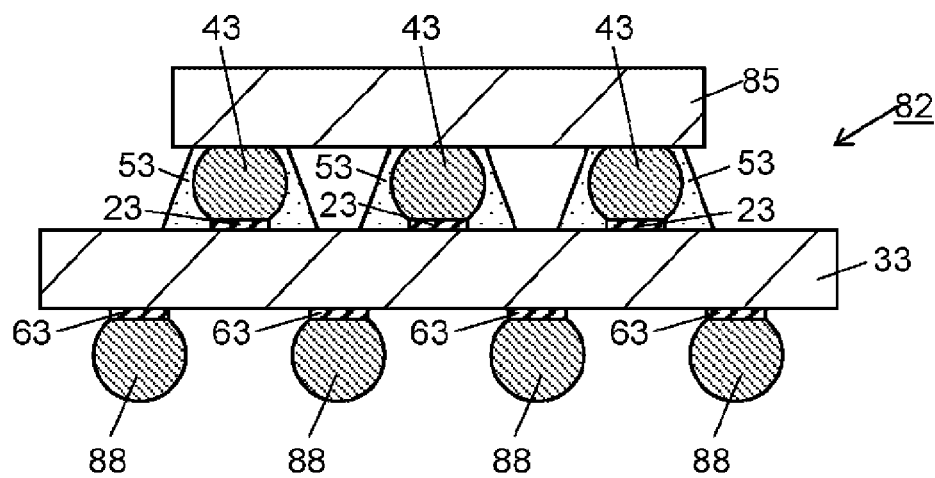
FIG. 10 is a schematic sectional view showing a semiconductor component according to a third exemplary embodiment of the present invention and showing a step E2 of a method for manufacturing a semiconductor mounted article according to the third exemplary embodiment of the present invention.

FIG. 10 is a schematic sectional view showing semiconductor component 82 according to a third exemplary embodiment of the present invention. Semiconductor component 82 includes semiconductor package 85, third substrate 33, third solder bonding part 43, and third resin reinforcing part 53. Hereinafter, described are these elements constituting semiconductor component 82. In semiconductor component 82, a vertical direction is defined with semiconductor package 85 set as an upper element and third substrate 33 set as a lower element. The definition, however, is no more than a definition for conveniently describing the semiconductor component. Further, ordinal numbers such as "third" are applied to avoid confusion of constitutional elements and do not mean numerical limitation of the elements.

(Semiconductor Package)

Semiconductor package 85 is not particularly limited. Specific examples of semiconductor package 85 include a BGA and a CSP.

(Third Substrate)

Third substrate 33 is a printed wiring board and is not particularly limited. Third pad 23 is formed on an upper surface of third substrate 33. At least one third pad 23 is formed. When semiconductor component 82 is mounted on fourth substrate 34 described later, third substrate 33 may be an interposer. In this case, it is preferred to form land 63 on a lower surface of third substrate 33 and to form fourth solder bump 88 on land 63. With such an interposer, or third substrate 33, a wiring pitch of semiconductor package 85 in semiconductor component 82 can be converted into a wiring pitch of fourth substrate 34.

(Third Solder Bonding Part)

Third solder bonding part 43 electrically bonds semiconductor package 85 with third pad 23 on the upper surface of third substrate 33.

Third solder bonding part 43 has a melting point ranging preferably from 100° C. to 240° C., inclusive, more preferably from 130° C. to 240° C., inclusive. Third solder bonding part 43 having a melting point lower than 100° C. weakens solder itself, possibly not giving sufficient strength. Third solder bonding part 43 having a melting point higher than 240° C. highly likely allows a third thermosetting resin binder that forms third resin reinforcing part 53 and is described later to inhibit self-aggregation of solder powder in soldering.

Third solder bonding part 43 is preferably formed of one or more types of solder selected from the group consisting of Sn—Ag—Cu solder and Sn—Bi solder. Such solder can increase bonding strength of third solder bonding part 43 and suppress generation of defects such as a crack.

(Third Resin Reinforcing Part)

Third resin reinforcing part 53 is formed in contact with third solder bonding part 43 and reinforces third solder bonding part 43. Third resin reinforcing part 53 is in contact with at least either one of a lower surface of semiconductor package 85 and the upper surface of third substrate 33.

Third resin reinforcing part 53 is formed of a cured product of the third thermosetting resin binder. The third thermosetting resin binder is the same as the thermosetting resin binder in the paste thermosetting resin composition according to the first exemplary embodiment. That is, the third thermosetting resin binder further contains a benzoxazine compound having two or more oxazine rings. Addition of the benzoxazine compound raises a curing start temperature of the third thermosetting resin binder during heating for soldering. This does not always mean that the third thermosetting resin binder has a curing start temperature higher than a melting point of the solder powder but means that the third thermosetting resin binder has a curing start temperature not excessively lower than the melting point of the solder powder. Depending on a degree of progression of a curing reaction of the third thermosetting resin binder, when the solder powder has a high melting point and the third thermosetting resin binder has a low curing start temperature, a difference between the melting point and the curing start temperature is, as a rough indication, preferably within 40° C. Thus, it is possible to prevent the third thermosetting resin binder from inhibiting the self-aggregation of the solder powder during melting, allowing easy self-aggregation and integration of solder melted. An aggregation state of the solder powder is excellent in third solder bonding part 43.

The third thermosetting resin binder preferably further contains a di- or higher functional oxetane compound. Addition of the oxetane compound makes, in heating for soldering, curing speed of the third thermosetting resin binder lower than speed at which the solder powder is melted and integrated. Thus, it is possible to prevent the third thermosetting resin binder from inhibiting the self-aggregation of the solder powder during melting, allowing easy self-aggregation and integration of solder melted. Such integration forms third solder bonding part 43. The aggregation state of the solder powder becomes more excellent in third solder bonding part 43.

The third thermosetting resin binder preferably further contains a di- or higher functional epoxy compound. Addition of the epoxy compound can eventually suppress generation of an uncured portion of the third thermosetting resin binder and increase strength of third resin reinforcing part 53 that is a cured product of the third thermosetting resin binder.

Figure 11A:
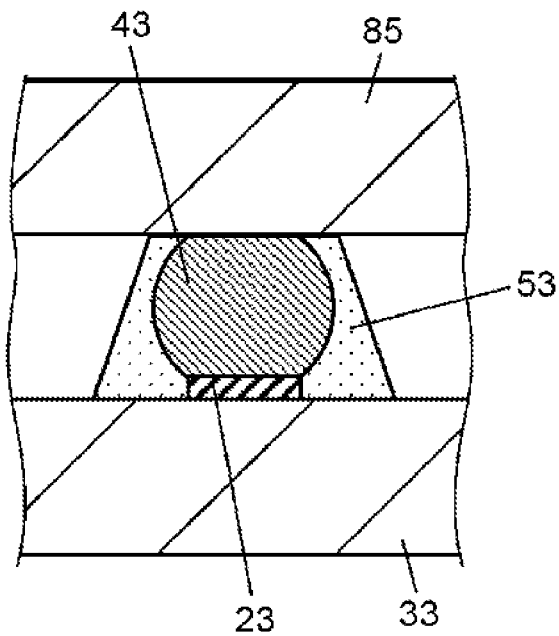
FIG. 11A is a schematic sectional view showing a part of the semiconductor component shown in FIG. 10.

FIG. 11A is a schematic sectional view showing a part of semiconductor component 82 shown in FIG. 10. As shown in FIG. 11A, an entire side surface of third solder bonding part 43 may be covered with third resin reinforcing part 53 so that third solder bonding part 43 is not exteriorly exposed. In this case, third resin reinforcing part 53 is in contact with both the lower surface of semiconductor package 85 and the upper surface of third substrate 33 to improve a reinforcing effect for third solder bonding part 43 by third resin reinforcing part 53.

Figure 11B:
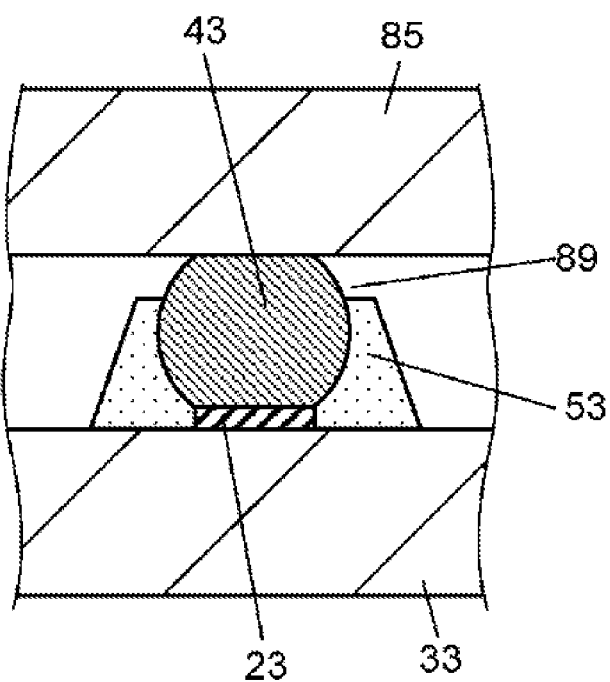
FIG. 11B is a schematic sectional view showing another part of the semiconductor component shown in FIG. 10.

FIG. 11B is a schematic sectional view showing another part of semiconductor component 82 shown in FIG. 10. As shown in FIG. 11B, third resin reinforcing part 53 may be provided with gap 89 so that a part of third solder bonding part 43 is exteriorly exposed. Third solder bonding part 43 is remelted to expand when heated to the melting point or higher, so that melted solder has nowhere to go when the entire side surface of third solder bonding part 43 is covered with third resin reinforcing part 53, exploding third resin reinforcing part 53 to possibly generate solder flash or a solder bridge. Even when third solder bonding part 43 is melted, third resin reinforcing part 53 that is provided with gap 89 as shown in FIG. 11B allows an increase in volume of solder to once go out through gap 89. Subsequently, when cooled to lower than the melting point, the solder that has gone out returns to an original place through gap 89 to re-form third solder bonding part 43, suppressing generation of solder flash and a solder bridge. In FIG. 11B, gap 89 is provided so as not to allow third resin reinforcing part 53 to be in contact with the lower surface of semiconductor package 85. A formation location of gap 89, however, is not particularly limited. When third solder bonding part 43 once formed is not reheated to the melting point or higher, third resin reinforcing part 53 is not necessarily provided with gap 89. For example, when secondary mounting is performed after primary mounting, a location of the first mounting can be reheated during the secondary mounting, so that a form shown in FIG. 11B is preferably employed in the primary mounting.

[Method for Manufacturing Semiconductor Component]

A method for manufacturing semiconductor component 82 according to the present exemplary embodiment includes steps A3 to D3. Hereinafter, the steps are sequentially described.

(Step A3)

Figure 12:
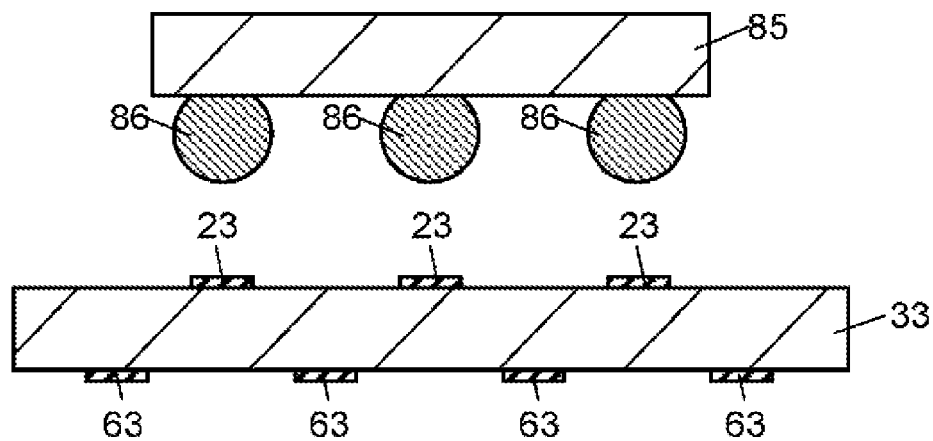
FIG. 12 is a schematic sectional view showing a step A3 of a method for manufacturing the semiconductor component shown in FIG. 10 and a step A4 of the method for manufacturing a semiconductor mounted article.

FIG. 12 is a schematic sectional view showing the step A3 of the method for manufacturing semiconductor component 82 shown in FIG. 10. In the step A3, semiconductor package 85 and third substrate 33 are prepared as shown in FIG. 12.

As described above, semiconductor package 85 is specifically a chip size package, for example. Third solder bump 86 is formed on a lower surface of semiconductor package 85. At least one third solder bump 86 is formed. Third solder bump 86 is preferably formed of one or more types of solder selected from the group consisting of Sn—Ag—Cu solder and Sn—Bi solder. Such solder can increase bonding strength of third solder bonding part 43 and suppress generation of defects such as a crack.

Third substrate 33 is specifically a printed wiring board as described above. Third pad 23 is formed on an upper surface of third substrate 33. Third pad 23 is formed as many as third solder bump 86. Third solder bump 86 and third pad 23 are formed so as to correspond to each other on a one-to-one basis when the lower surface of semiconductor package 85 is made to face the upper surface of third substrate 33. Land 63 may be formed on a lower surface of third substrate 33. Land 63 can be used for secondary mounting.

(Step B3)

Figure 13:
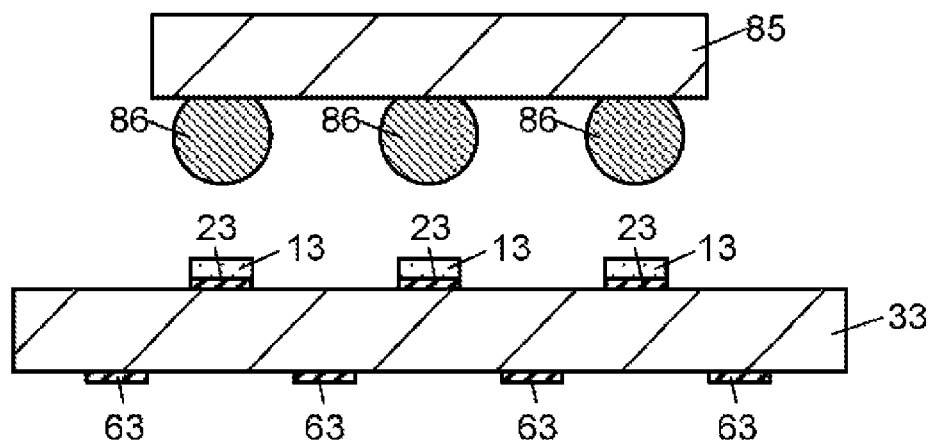
FIG. 13 is a schematic sectional view showing a step B3 of the method for manufacturing the semiconductor component shown in FIG. 10 and a step B4 of the method for manufacturing a semiconductor mounted article.

FIG. 13 is a schematic sectional view showing the step B3 of the method for manufacturing the semiconductor component shown in FIG. 10. In the step B3, third paste thermosetting resin composition 13 is applied to third pad 23 of third substrate 33 as shown in FIG. 13. When a plurality of third pads 23 are formed on third substrate 33, third paste thermosetting resin composition 13 is preferably applied to each of third pads 23.

Here, third paste thermosetting resin composition 13 is the same as the paste thermosetting resin according to the first exemplary embodiment. That is, third paste thermosetting resin composition 13 contains solder powder, third thermosetting resin binder, an activator, and a thixotropy imparting agent. The third thermosetting resin binder contains a main agent and a curing agent. The curing agent contains a benzoxazine compound.

Thus, third paste thermosetting resin composition 13 contains solder powder that has a melting point ranging from 100° C. to 240° C., inclusive, a benzoxazine compound having two or more oxazine rings, an activator, and a thixotropy imparting agent. Addition of the benzoxazine compound can raise a curing reaction start temperature of the third thermosetting resin binder. Accordingly, it is possible to prevent the third thermosetting resin binder from inhibiting self-aggregation of the solder powder during melting, allowing easy self-aggregation and integration of solder melted.

The solder powder may be formed of powder of one or more types of solder selected from the group consisting of Sn—Ag—Cu solder and Sn—Bi solder.

Third paste thermosetting resin composition 13 preferably further contains a di- or higher functional oxetane compound. Addition of the oxetane compound can further accelerate the integration through the self-aggregation of the solder melted.

Third paste thermosetting resin composition 13 preferably further contains a di- or higher functional epoxy compound. Such further addition of the epoxy compound can eventually suppress generation of an uncured portion of the third thermosetting resin binder and increase strength of a cured product.

A method for applying third paste thermosetting resin composition 13 to third pad 23 of third substrate 33 is not particularly limited. Specific examples of the application method include screen printing and a dispensing method.

(Step C3)

Figure 14:
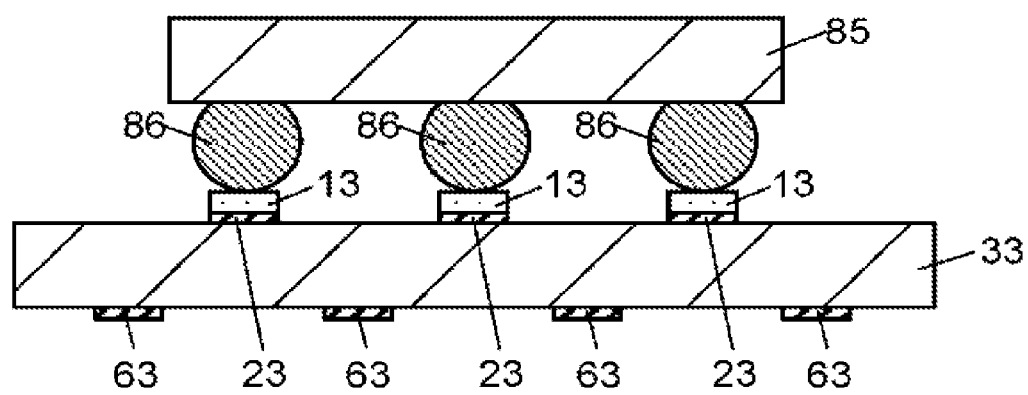
FIG. 14 is a schematic sectional view showing steps C3 and D3 of the method for manufacturing the semiconductor component shown in FIG. 10 and steps C4 and D4 of the method for manufacturing a semiconductor mounted article.

FIG. 14 is a schematic sectional view showing the steps C3 and D3 of the method for manufacturing the semiconductor component shown in FIG. 10. In the step C3, third solder bump 86 of semiconductor package 85 is disposed on third pad 23 of third substrate 33 as shown in FIG. 14. In the disposition, third paste thermosetting resin composition 13 is interposed between third solder bump 86 and third pad 23.

(Step D3)

Figure 15A:
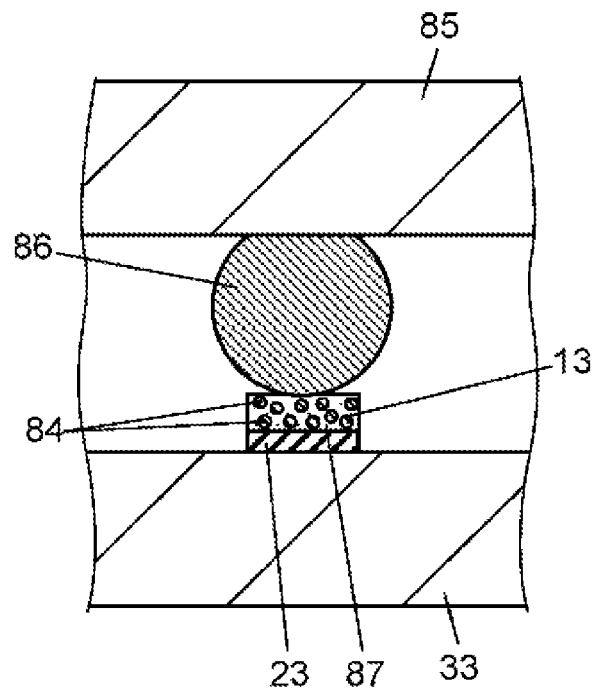
FIG. 15A is an enlarged schematic sectional view of a part in FIG. 14.

In the step D3, reflow soldering is performed by heating semiconductor package 85 and third substrate 33 in a state shown in FIG. 14 for 4 minutes or more in such a manner that a peak temperature ranges from 220° C. to 260° C., inclusive. Although an upper limit of a heating period is not particularly limited, the heating period is, for example, 10 minutes and the upper limit of the heating period particularly at the peak temperature is, for example, 1 minute. FIG. 15A is an enlarged schematic sectional view of a part in FIG. 14.

Third paste thermosetting resin composition 13 containing solder powder 84 and third thermosetting resin binder 87 is applied to third pad 23 and is in contact with third solder bump 86. The activator and the thixotropy imparting agent are not shown in the drawing. The peak temperature is basically set to a temperature 20° C. to 30° C. higher than the melting point of solder powder 84 contained in third paste thermosetting resin composition 13.

Here, depending on materials for third solder bump 86 and solder powder 84, following three cases are assumed: (1) when third solder bump 86 has the same melting point as the melting point of solder powder 84; (2) when third solder bump 86 has a low melting point and solder powder 84 has a high melting point; and (3) third solder bump 86 has a high melting point and solder powder 84 has a low melting point.

Figure 15B:
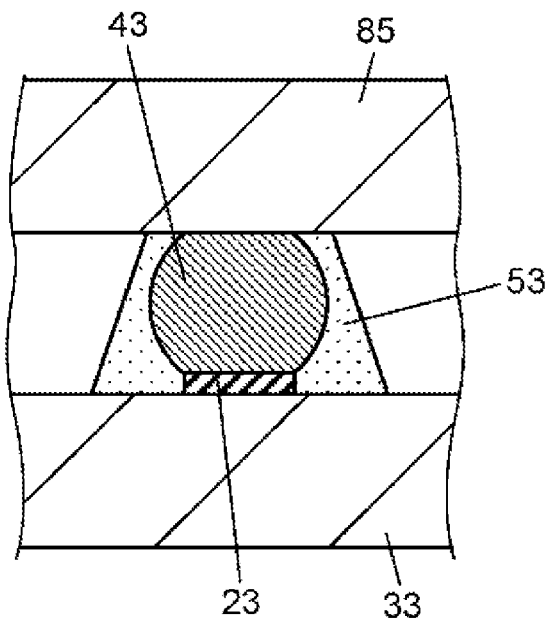
FIG. 15B is a schematic sectional view showing a part of the semiconductor component shown in FIG. 10.

FIG. 15B is a schematic sectional view showing a part of semiconductor component 82 shown in FIG. 10. In the cases (1) and (2), when the peak temperature is set to a temperature 20° C. to 30° C. higher than the melting point of solder powder 84, third solder bump 86 can also be melted. Thus, both third solder bump 86 and solder powder 84 are melted, mixed, and integrated to form, from a state shown in FIG. 15A, strong third solder bonding part 43 as shown in FIG. 15B. Further, since third paste thermosetting resin composition 13 contains the benzoxazine compound, it is possible to prevent inhibition of the self-aggregation of third solder bump 86 and solder powder 84 during melting, allowing easy self-aggregation and integration of solder melted.

Figure 15C:
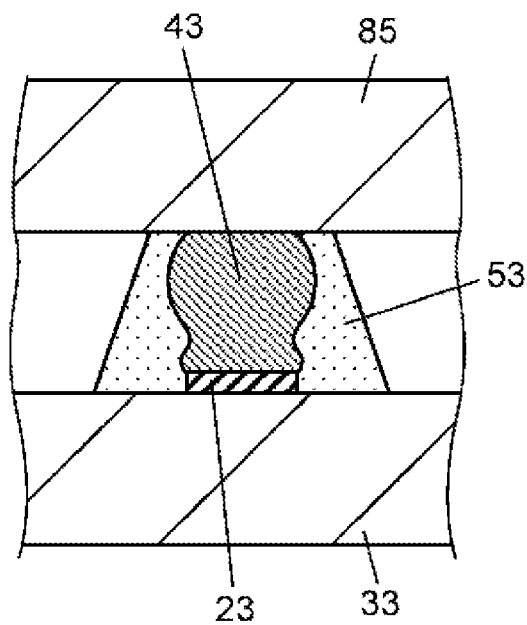
FIG. 15C is a schematic sectional view showing another part of the semiconductor component shown in FIG. 10.

FIG. 15C is a schematic sectional view showing another part of semiconductor 82 shown in FIG. 10. In the case (3), even when the peak temperature is set to a temperature 20° C. to 30° C. higher than the melting point of solder powder 84, third solder bump 86 is not sometimes melted. One example of this case is a case in which third solder bump 86 is formed of Sn—Ag—Cu solder (melting point 218° C. to 219° C.) and solder powder 84 is powder of Sn—Bi solder (melting point 138° C. to 139° C.). In this case, even when the peak temperature is set to 160° C., third solder bump 86 is not melted. Thus, only solder powder 84 is melted to form, from the state shown in FIG. 15A, third solder bonding part 43 having a constricted part as shown in FIG. 15C. This constricted part includes an interface between third solder bump 86 and solder formed by melting and subsequent integration of solder powder 84. Third solder bonding part 43 shown in FIG. 15C is, due to the constricted part, weaker in strength than third solder bonding part 43 shown in FIG. 15B. However, no problem is particularly found in overall reliability due to reinforcement by third resin reinforcing part 53. In the case (3), the peak temperature is preferably set to a temperature 20° C. to 30° C. higher than the melting point of third solder bump 86. Such setting can melt both third solder bump 86 and solder powder 84 to form strong third solder bonding part 43 shown in FIG. 15B. For example, when third solder bump 86 is formed of Sn—Ag—Cu solder (melting point 218° C. to 219° C.) and solder powder 84 is powder of Sn—Bi solder (melting point 138° C. to 139° C.), the peak temperature may be set to 240° C. Since third paste thermosetting resin composition 13 contains the benzoxazine compound, it is possible to prevent inhibition of the self-aggregation of solder powder 84 during melting when the peak temperature is the melting point of solder powder 84 or higher. Thus, melted solder undergoes easy self-aggregation and integration. As described above, the peak temperature is preferably set to a temperature 20° C. to 30° C. higher than the melting point of third solder bump 86. Such setting can melt both third solder bump 86 and solder powder 84 to prevent inhibition of the self-aggregation of third solder bump 86 and solder powder 84 during melting. Thus, melted solder can undergo easy self-aggregation and integration to form strong third solder bonding part 43 having no constricted part.

A temperature rise rate to reach the peak temperature preferably ranges from 1° C./s to 4° C./s, inclusive. A temperature rise rate of 1° C./s or more can suppress an increase in viscosity of the third paste thermosetting resin composition, which is caused by progression of a curing reaction of third thermosetting resin binder 87 before the temperature reaches the melting point of solder powder 84. Addition of the oxetane compound can further accelerate the integration through the self-aggregation of the solder melted. A temperature rise rate of 4° C./s or less enables securement of sufficient time for removing an oxide film of solder powder 84 through a reduction action of the activator. This can further accelerate wettability of the solder. Although a heating start temperature is usually normal temperature, the heating start temperature is not particularly limited.

After completion of the reflow soldering, semiconductor component 82 as shown in FIG. 10 can be obtained. Fourth solder bump 88 is formed on land 63 of the lower surface of third substrate 33 in semiconductor component 82. Land 63 and fourth solder bump 88, however, are unnecessary when secondary mounting is not performed. Neither the activator nor the thixotropy imparting agent is preferably left in third resin reinforcing part 53. Small amounts of the activator and the thixotropy imparting agent, however, may be left as long as the amounts do not impair reliability. Accordingly, it is unnecessary to remove the activator and the thixotropy imparting agent through washing.

As described above, in the present exemplary embodiment, since third paste thermosetting resin composition 13 contains the benzoxazine compound, it is possible to prevent inhibition of melting and aggregation of solder powder 84 in soldering regardless of a high or low melting point of solder powder 84.

[Semiconductor Mounted Article]

Figure 16:
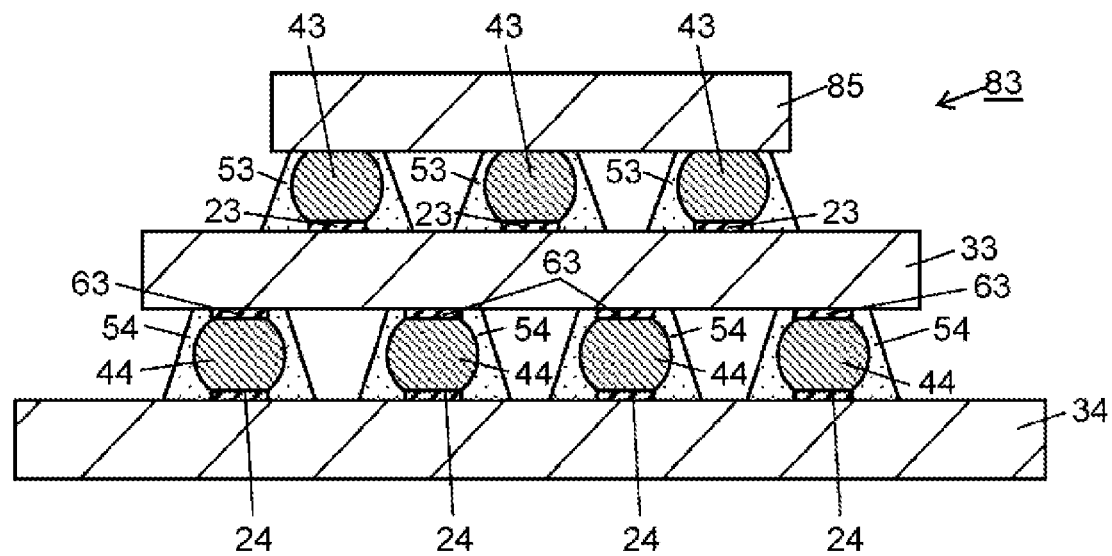
FIG. 16 is a schematic sectional view showing a semiconductor mounted article according to the third exemplary embodiment of the present invention.

FIG. 16 is a schematic sectional view showing one example of semiconductor mounted article 83 according to the third exemplary embodiment of the present invention. Semiconductor mounted article 83 includes semiconductor package 85, third substrate 33, third solder bonding part 43, third resin reinforcing part 53, fourth substrate 34, fourth solder bonding part 44, and fourth resin reinforcing part 54. Described are these elements constituting semiconductor mounted article 83. In semiconductor mounted article 83, a vertical direction is defined with semiconductor package 85 set as an upper element and fourth substrate 34 set as a lower element. The definition, however, is no more than a definition for conveniently describing the semiconductor mounted article. Further, ordinal numbers such as "third" are applied to avoid confusion of constitutional elements and do not mean numerical limitation of the elements.

(Semiconductor Package)

Semiconductor package 85 is not particularly limited. Specific examples of semiconductor package 85 include a BGA and a CSP.

(Third Substrate and Fourth Substrate)

Third substrate 33 and fourth substrate 34 are printed wiring boards and are not particularly limited. Third pad 23 is formed on an upper surface of third substrate 33. At least one third pad 23 is formed. Land 63 is formed on a lower surface of third substrate 33. At least one land 63 is formed. Third substrate 33 that functions as an interposer can convert a wiring pitch of semiconductor package 85 into a wiring pitch of fourth substrate 34. Fourth pad 24 is formed on an upper surface of fourth substrate 34. Fourth pad 24 is formed as many as land 63 of third substrate 33. Fourth substrate 34 can become a mother board or a main board.

(Third Solder Bonding Part and Fourth Solder Bonding Part)

Third solder bonding part 43 electrically bonds semiconductor package 85 with third pad 23 on the upper surface of third substrate 33.

Fourth solder bonding part 44 electrically bonds land 63 on the lower surface of third substrate 33 with fourth pad 24 on the upper surface of fourth substrate 34.

Third solder bonding part 43 and fourth solder bonding part 44 have a melting point ranging preferably from 100° C. to 240° C., inclusive, more preferably from 130° C. to 240° C., inclusive. Third solder bonding part 43 and fourth solder bonding part 44 that have a melting point lower than 100° C. weaken solder itself, possibly not giving sufficient strength. Third solder bonding part 43 and fourth solder bonding part 44 that have a melting point higher than 240° C. highly likely allow a third thermosetting resin binder that forms third resin reinforcing part 53 and is described later and a fourth thermosetting resin binder that forms fourth resin reinforcing part 54 and is described later, to inhibit self-aggregation of solder powder in soldering.

Third solder bonding part 43 and fourth solder bonding part 44 are preferably formed of one or more types of solder selected from the group consisting of Sn—Ag—Cu solder and Sn—Bi solder. Such solder can increase bonding strength of third solder bonding part 43 and fourth solder bonding part 44 and suppress generation of defects such as a crack.

(Third Resin Reinforcing Part and Fourth Resin Reinforcing Part)

Third resin reinforcing part 53 is formed in contact with third solder bonding part 43 and reinforces third solder bonding part 43. Third resin reinforcing part 53 is in contact with at least either one of a lower surface of semiconductor package 85 and the upper surface of third substrate 33.

Fourth resin reinforcing part 54 is formed in contact with fourth solder bonding part 44 and reinforces fourth solder bonding part 44. Fourth resin reinforcing part 54 is in contact with at least either one of the lower surface of third substrate 33 and the upper surface of fourth substrate 34.

Third resin reinforcing part 53 is formed of a cured product of the third thermosetting resin binder. Fourth resin reinforcing part 54 is formed of a cured product of the fourth thermosetting resin binder. The third thermosetting resin binder and the fourth thermosetting resin binder are the same as the thermosetting resin binder in the paste thermosetting resin composition described above. That is, the third thermosetting resin binder and the fourth thermosetting resin binder each further contain a benzoxazine compound having two or more oxazine rings. Addition of the benzoxazine compound raises a curing start temperature of one of or both the third thermosetting resin binder and the fourth thermosetting resin binder during heating for soldering. This does not always mean, in a case of, for example, the third thermosetting resin binder containing the benzoxazine compound, that the third thermosetting resin binder has a curing start temperature higher than a melting point of the solder powder, but means that third thermosetting resin binder has a curing start temperature not excessively lower than the melting point of the solder powder. Depending on a degree of progression of a curing reaction of the third thermosetting resin binder, when solder powder 84 has a high melting point and the third thermosetting resin binder has a low curing start temperature, a difference between the melting point and the curing start temperature is, as a rough indication, preferably within 40° C. The same applies to a case of the fourth thermosetting resin binder containing the benzoxazine compound. Thus, it is possible to further increase an effect of suppressing inhibition of the self-aggregation of the solder powder during melting, allowing easy self-aggregation and integration of solder melted. An aggregation state of the solder powder is excellent in third solder bonding part 43 and fourth solder bonding part 44.

One of or both the third thermosetting resin binder and the fourth thermosetting resin binder preferably further contain a di- or higher functional oxetane compound. Addition of the oxetane compound makes, in heating for soldering, curing speed of the third thermosetting resin binder and the fourth thermosetting resin binder lower than speed at which the solder powder is melted and integrated. Thus, it is possible to prevent the third thermosetting resin binder and the fourth thermosetting resin binder from inhibiting the self-aggregation of the solder powder during melting, allowing easy self-aggregation and integration of solder melted. The aggregation state of the solder powder becomes more excellent in third solder bonding part 43 and fourth solder bonding part 44. Specific types and contents of constitutional components may be the same or different between the third thermosetting resin binder and the fourth thermosetting resin binder.

One of or both the third thermosetting resin binder and the fourth thermosetting resin binder preferably further contain a di- or higher functional epoxy compound. The third thermosetting resin binder containing the epoxy compound can eventually suppress generation of an uncured portion of third thermosetting resin binder 87 and increase strength of third resin reinforcing part 53 that is a cured product of the third thermosetting resin binder. In the same manner, the fourth thermosetting resin binder containing the epoxy compound can eventually suppress generation of an uncured portion of the fourth thermosetting resin binder and increase strength of fourth resin reinforcing part 54 that is a cured product of the fourth thermosetting resin binder.

In the same manner as in FIG. 11A, an entire side surface of third solder bonding part 43 may be covered with third resin reinforcing part 53 so that third solder bonding part 43 is not exteriorly exposed. In this case, third resin reinforcing part 53 is in contact with the lower surface of semiconductor package 85 and the upper surface of third substrate 33 to improve a reinforcing effect for third solder bonding part 43 by third resin reinforcing part 53. The same manner as in third resin reinforcing part 53 applies to fourth resin reinforcing part 54.

In the same manner as in FIG. 11B, third resin reinforcing part 53 may be provided with gap 89 so that a part of third solder bonding part 43 is exteriorly exposed. When third solder bonding part 43 is melted to increase in volume, an increase of solder once goes out through gap 89, and then returns to an original place repassing through gap 89 at a temperature lower than the melting point of third solder bonding part 43, to suppress generation of solder flash and a solder bridge. The same manner as in third resin reinforcing part 53 applies to fourth resin reinforcing part 54. When fourth solder bonding part 44 is not reheated to the melting point or higher, not a form shown in FIG. 11B but a form shown in FIG. 11A is preferably employed for fourth solder bonding part 44.

[Method for Manufacturing Semiconductor Mounted Article]

A method for manufacturing semiconductor mounted article 83 according to the present exemplary embodiment includes following steps A4 to H4. Hereinafter, the steps are sequentially described.

(Step A4)

FIG. 12 is a schematic sectional view showing the step A4 of the method for manufacturing semiconductor mounted article 83 shown in FIG. 10. As shown in FIG. 12, the step A4 is almost the same as the step A3 of the method for manufacturing semiconductor component 82 described above. For performing secondary mounting, however, land 63 is formed on a lower surface of third substrate 33. At least one land 63 is formed.

(Step B4)

FIG. 13 is a schematic sectional view showing the step B4 of the method for manufacturing semiconductor mounted article 83 shown in FIG. 10. As shown in FIG. 13, the step B4 is the same as the step B3 of the method for manufacturing semiconductor component 82 described above.

(Steps C4 and D4)

FIG. 14 is a schematic sectional view showing the steps C4 and D4 of the method for manufacturing semiconductor mounted article 83 shown in FIG. 10. As shown in FIG. 14, the steps C4 and D4 are the same as the steps C3 and D3 of the method for manufacturing semiconductor component 82 described above. The steps A4 to D4 are steps for primary mounting, and completion of the step D4 completes the primary mounting. Semiconductor component 82 described earlier is obtained after the primary mounting.

(Step E4)

In the step E4, fourth solder bump 88 is formed on land 63 of the lower surface of third substrate 33 as shown in FIG. 10. When a plurality of lands 63 are formed on third substrate 33, fourth solder bump 88 is formed for each of lands 63. Fourth solder bump 88 is preferably formed of one or more types of solder selected from the group consisting of Sn—Ag—Cu solder and Sn—Bi solder. Such solder can increase bonding strength of fourth solder bonding part 44 and suppress generation of defects such as a crack.

(Step F4)

Figure 17:
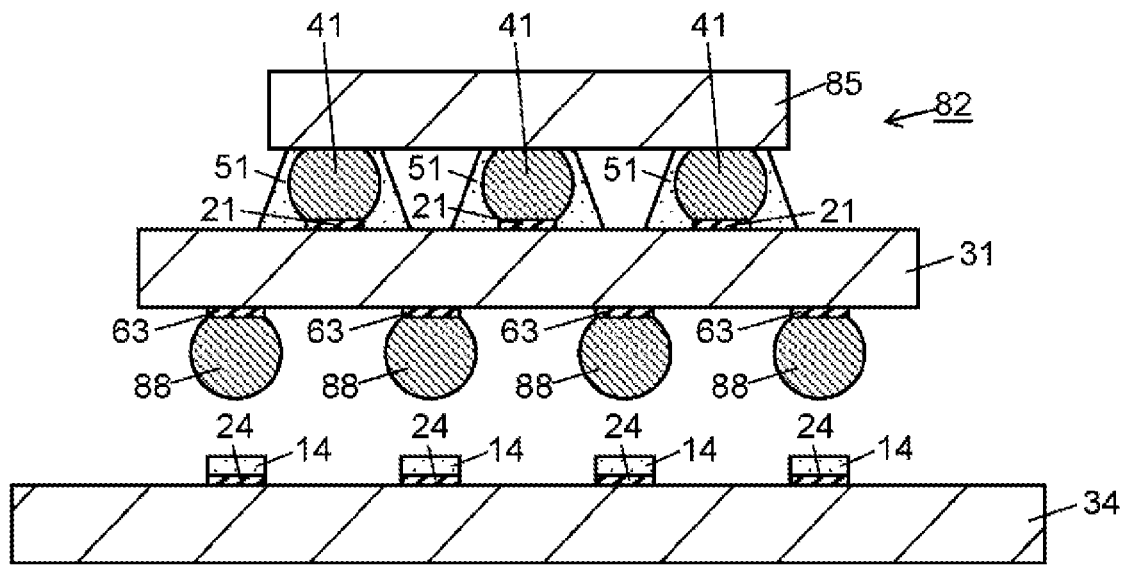
FIG. 17 is a schematic sectional view showing a step F4 of the method for manufacturing the semiconductor mounted article shown in FIG. 16.

FIG. 17 is a schematic sectional view showing the step F4 of the method for manufacturing semiconductor mounted article 83 shown in FIG. 16. In the step F4, fourth substrate 34 is prepared as shown in FIG. 17. Fourth substrate 34 is specifically a printed wiring board as described above. Fourth pad 24 is formed on an upper surface of fourth substrate 34. Fourth pad 24 is formed as many as fourth solder bump 88. Fourth solder bump 88 and fourth pad 24 are formed so as to correspond to each other on a one-to-one basis when the lower surface of third substrate 33 is made to face the upper surface of fourth substrate 34.

Further in the step F4, fourth paste thermosetting resin composition 14 is applied to fourth pad 24 of fourth substrate 34. When a plurality of fourth pads 24 are formed on fourth substrate 34, fourth paste thermosetting resin composition 14 is preferably applied to each of fourth pads 24.

Here, fourth paste thermosetting resin composition 14 is the same as the paste thermosetting resin described above. That is, fourth paste thermosetting resin composition 14 contains solder powder, a fourth thermosetting resin binder, an activator, and a thixotropy imparting agent. The fourth thermosetting resin binder contains a main agent and a curing agent. The curing agent contains a benzoxazine compound.

Thus, fourth paste thermosetting resin composition 14 contains solder powder that has a melting point ranging from 100° C. to 240° C., inclusive, a benzoxazine compound having two or more oxazine rings, an activator, and a thixotropy imparting agent. Addition of the benzoxazine compound can raise a curing reaction start temperature of the fourth thermosetting resin binder. Accordingly, it is possible to prevent the fourth thermosetting resin binder from inhibiting self-aggregation of the solder powder during melting, allowing easy self-aggregation and integration of solder melted. Specific types and contents of constitutional components may be the same or different between third paste thermosetting resin composition 13 and fourth paste thermosetting resin composition 14.

The solder powder may be formed of powder of one or more types of solder selected from the group consisting of Sn—Ag—Cu solder and Sn—Bi solder.

Fourth paste thermosetting resin composition 14 preferably further contains a di- or higher functional oxetane compound. Addition of the oxetane compound can further accelerate the integration through the self-aggregation of the solder melted.

Fourth paste thermosetting resin composition 14 preferably further contains a di- or higher functional epoxy compound. Such further addition of the epoxy compound can eventually suppress generation of an uncured portion of the fourth thermosetting resin binder and increase strength of a cured product.

A method for applying fourth paste thermosetting resin composition 14 to fourth pad 24 of fourth substrate 34 is not particularly limited. Specific examples of the application method include screen printing and a dispensing method.

(Step G4)

Figure 18:
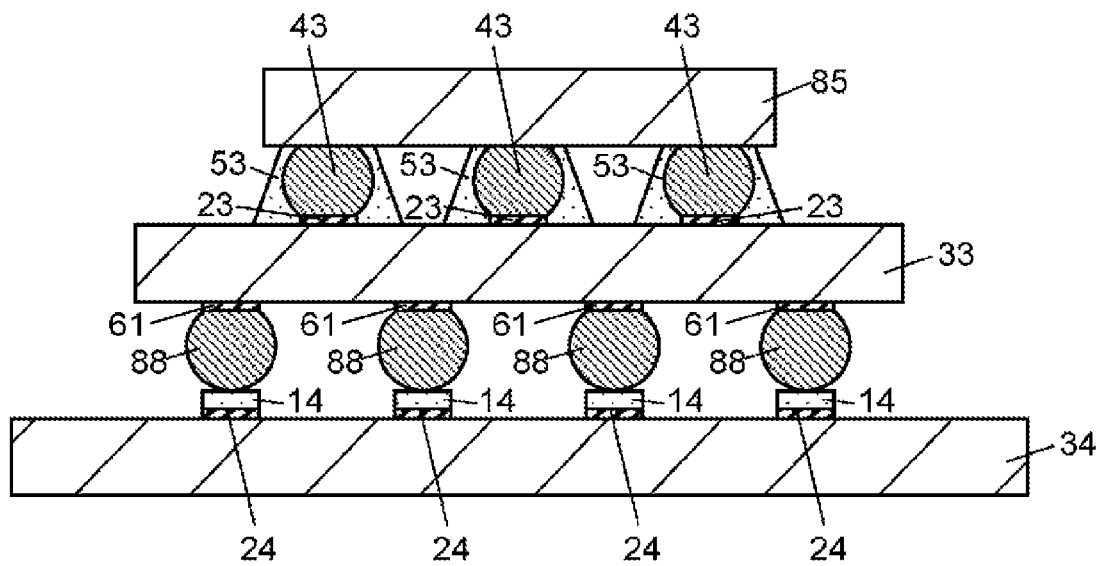
FIG. 18 is a schematic sectional view showing steps G4 and H4 of the method for manufacturing the semiconductor mounted article shown in FIG. 16.

FIG. 18 is a schematic sectional view showing the steps G4 and H4 of the method for manufacturing semiconductor mounted article 83 shown in FIG. 16. In the step G4, fourth solder bump 88 of third substrate 33 is disposed on fourth pad 24 of fourth substrate 34 as shown in FIG. 18. In the disposition, fourth paste thermosetting resin composition 14 is interposed between fourth solder bump 88 and fourth pad 24.

(Step H4)

In the step H4, reflow soldering is performed by heating semiconductor package 85, third substrate 33, and fourth substrate 34 in a state shown in FIG. 18 for 4 minutes or more in such a manner that a peak temperature ranges from 220° C. to 260° C., inclusive. Although an upper limit of a heating period is not particularly limited, the heating period is, for example, 10 minutes and the upper limit of the heating period particularly at the peak temperature is, for example, 1 minute. The peak temperature is basically set to a temperature 20° C. to 30° C. higher than the melting point of the solder powder contained in fourth paste thermosetting resin composition 14.

Here, depending on materials for fourth solder bump 88 and the solder powder, following three cases are assumed: (1) when fourth solder bump 88 has the same melting point as the melting point of the solder powder; (2) when fourth solder bump 88 has a low melting point and the solder powder has a high melting point; and (3) fourth solder bump 88 has a high melting point and the solder powder has a low melting point.

In the cases (1) and (2), when the peak temperature is set to a temperature 20° C. to 30° C. higher than the melting point of the solder powder, fourth solder bump 88 can also be melted. Thus, both fourth solder bump 88 and the solder powder are melted, mixed, and integrated to form strong fourth solder bonding part 44. Further, since fourth paste thermosetting resin composition 14 contains the benzoxazine compound, it is possible to prevent inhibition of the self-aggregation of fourth solder bump 88 and the solder powder during melting, allowing easy self-aggregation and integration of solder melted.

In the cases (1) and (2), when third solder bonding part 43 that has been formed in the primary mounting has a melting point higher than the melting point of the solder powder in second paste resin composition 12, the peak temperature may be set to a temperature between the melting point of the solder powder (inclusive) and the melting point of third solder bonding part 43. Such a peak temperature does not allow remelting of third solder bonding part 43 in the secondary mounting to further suppress generation of solder flash and a solder bridge.

In the case (3), even when the peak temperature is set to a temperature 20° C. to 30° C. higher than the melting point of the solder powder, fourth solder bump 88 is not sometimes melted. One example of this case is a case in which fourth solder bump 88 is formed of Sn—Ag—Cu solder (melting point 218° C. to 219° C.) and the solder powder is powder of Sn—Bi solder (melting point 138° C. to 139° C.). In this case, even when the peak temperature is set to 160° C., fourth solder bump 88 is not melted. Thus, only the solder powder is melted to form fourth solder bonding part 44 having a constricted part. This constricted part includes an interface between fourth solder bump 88 and solder formed by melting and subsequent integration of the solder powder. Fourth solder bonding part 44 including a constricted part weakens in strength. However, no problem is particularly found in overall reliability due to reinforcement by fourth resin reinforcing part 54. In the case (3), the peak temperature is preferably set to a temperature 20° C. to 30° C. higher than the melting point of fourth solder bump 88. Such setting can melt both fourth solder bump 88 and the solder powder to form strong fourth solder bonding part 44 having no constricted part. For example, when fourth solder bump 88 is formed of Sn—Ag—Cu solder (melting point 218° C. to 219° C.) and the solder powder is powder of Sn—Bi solder (melting point 138° C. to 139° C.), as described above, the peak temperature may be set to 240° C. Since fourth paste thermosetting resin composition 14 contains the benzoxazine compound, it is possible to prevent inhibition of the self-aggregation of the solder powder during melting when the peak temperature is the melting point of the solder powder or higher. Thus, melted solder undergoes easy self-aggregation and integration. As described above, the peak temperature is preferably set to a temperature 20° C. to 30° C. higher than the melting point of fourth solder bump 88. Such setting can melt both fourth solder bump 88 and solder powder 84 to prevent inhibition of the self-aggregation of fourth solder bump 88 and solder powder 84 during melting. Thus, melted solder can undergo easy self-aggregation and integration to form strong fourth solder bonding part 44 having no constricted part.

In the case (3), when third solder bonding part 43 that has been formed in the primary mounting has a melting point higher than the melting point of fourth solder bump 88, the peak temperature may be set to a temperature between the melting point of the solder powder (inclusive) (preferably the melting point of fourth solder bump 88 (inclusive)) and the melting point of third solder bonding part 43. Such a peak temperature does not allow remelting of third solder bonding part 43 in the secondary mounting to further suppress generation of solder flash and a solder bridge.

A temperature rise rate to reach the peak temperature preferably ranges from 1° C./s to 4° C./s, inclusive. A temperature rise rate of 1° C./s or more can suppress an increase in viscosity of the fourth paste thermosetting resin composition, which is caused by progression of a curing reaction of the fourth thermosetting resin binder before the temperature reaches the melting point of solder powder. Addition of the oxetane compound can further accelerate the integration through the self-aggregation of the solder melted. A temperature rise rate of 4° C./s or less enables securement of sufficient time for removing an oxide film of the solder powder through a reduction action of the activator. This can further accelerate wettability of the solder. Although a heating start temperature is usually normal temperature, the heating start temperature is not particularly limited.

After completion of the reflow soldering, semiconductor mounted article 83 as shown in FIG. 16 can be obtained. That is, the steps E4 to H4 are steps for the secondary mounting, and completion of the step H4 completes the secondary mounting. Semiconductor mounted article 83 described earlier is obtained after the secondary mounting. Neither the activator nor the thixotropy imparting agent is preferably left in fourth resin reinforcing part 54. Small amounts of the activator and the thixotropy imparting agent, however, may be left as long as the amounts do not impair reliability. Accordingly, it is unnecessary to remove the activator and the thixotropy imparting agent through washing.

As described above, in the present exemplary embodiment, since fourth paste thermosetting resin composition 14 contains the benzoxazine compound, it is possible to prevent inhibition of melting and aggregation of the solder powder in soldering regardless of a high or low melting point of the solder powder.

As described above, semiconductor component 82 according to the present exemplary embodiment includes semiconductor package 85, third substrate 33 whose first surface corresponds to an upper surface and on the first surface of which third pad 23 is formed, and third solder bonding part 43 that electrically connects semiconductor package 85 with third pad 23. Semiconductor component 82 also includes third resin reinforcing part 53 that is formed in contact with third solder bonding part 43 and reinforces third solder bonding part 43. Third resin reinforcing part 53 is formed of a cured product of a third thermosetting resin binder that contains a benzoxazine compound having two or more oxazine rings. This makes an aggregation state of the solder powder excellent.

The third thermosetting resin binder may also contain a di- or higher functional oxetane compound.

Third solder bonding part 43 may have a melting point ranging from 100° C. to 240° C., inclusive.

Third solder bonding part 43 may be formed of one or more types of solder selected from the group consisting of Sn—Ag—Cu solder and Sn—Bi solder.

The third thermosetting resin binder may also contain a di- or higher functional epoxy compound.

Semiconductor mounted article 83 according to the present exemplary embodiment includes semiconductor package 85, and third substrate 33 whose first surface corresponds to an upper surface, on the first surface of which third pad 23 is formed, whose second surface corresponds to a lower surface opposite from the first surface, and on the second surface of which land 63 is formed. Semiconductor mounted article 83 also includes third solder bonding part 43 that electrically connects semiconductor package 85 with third pad 23, and third resin reinforcing part 53 that is formed in contact with third solder bonding part 43 and reinforces third solder bonding part 43. Semiconductor mounted article 83 also includes fourth substrate 34 whose one surface corresponds to an upper surface and on the one surface of which fourth pad 24 is formed, fourth solder bonding part 44 that electrically connects land 63 with fourth pad 24, and fourth resin reinforcing part 54 that is formed in contact with fourth solder bonding part 44 and reinforces fourth solder bonding part 44. Third resin reinforcing part 53 contains a benzoxazine compound having two or more oxazine rings. Third resin reinforcing part 53 is formed of a cured product of a third thermosetting resin binder, and fourth resin reinforcing part 54 is formed of a cured product of a fourth thermosetting resin binder that contains a benzoxazine compound having two or more oxazine rings. This makes an aggregation state of the solder powder excellent.

One of or both the third thermosetting resin binder and the fourth thermosetting resin binder may also contain a di- or higher functional oxetane compound.

Third solder bonding part 43 and fourth solder bonding part 44 may have a melting point ranging from 100° C. to 240° C., inclusive.

Third solder bonding part 43 and fourth solder bonding part 44 may be formed of one or more types of solder selected from the group consisting of Sn—Ag—Cu solder and Sn—Bi solder.

One of or both the third thermosetting resin binder and the fourth thermosetting resin binder may also contain a di- or higher functional epoxy compound.

A method for manufacturing semiconductor component 82 according to the present exemplary embodiment includes following steps A3 to D3. Step A3: preparing semiconductor package 85 whose second surface corresponds to a lower surface and on the second surface of which third solder bump 85 is formed and third substrate 33 whose first surface corresponds to an upper surface opposite to the second surface and on the first surface of which third pad 23 is formed; step B3: printing on third pad 23 a third paste thermosetting resin composition containing solder powder that has a melting point ranging from 100° C. to 240° C., inclusive, a benzoxazine compound having two or more oxazine rings, an activator, and a thixotropy imparting agent; step C3: disposing third solder bump 86 on third pad 23; and step D3: performing reflow soldering by heating semiconductor package 85 and third substrate 33 for 4 minutes or more in such a manner that a peak temperature ranges from 220° C. to 260° C., inclusive. This makes an aggregation state of the solder powder excellent.

The third paste thermosetting resin composition may also contain a di- or higher functional oxetane compound.

Third solder bump 86 may be formed of one or more types of solder selected from the group consisting of Sn—Ag—Cu solder and Sn—Bi solder.

The solder powder may be formed of powder of one or more types of solder selected from the group consisting of Sn—Ag—Cu solder and Sn—Bi solder.

The third paste thermosetting resin composition may also contain a di- or higher functional epoxy compound.

A temperature rise rate to reach the peak temperature may range from 1° C./s to 4° C./s, inclusive.

A method for manufacturing semiconductor mounted article 83 according to the present exemplary embodiment includes following steps A4 to H4. Step A4: preparing semiconductor package 85 whose one surface corresponds to a lower surface and on the one surface of which third solder bump 86 is formed, third substrate 33 whose first surface corresponds to an upper surface, on the first surface of which third pad 23 is formed, whose second surface corresponds to a lower surface opposite from the first surface, and on the second surface of which land 63 is formed, and fourth substrate 34 whose third surface corresponds to an upper surface and on the third surface of which fourth pad 24 is formed; step B4: printing on third pad 23 a third paste thermosetting resin composition containing solder powder that has a melting point ranging from 100° C. to 240° C., inclusive, a benzoxazine compound having two or more oxazine rings, an activator, and a thixotropy imparting agent; step C4: disposing third solder bump 86 on third pad 23; step D4: performing reflow soldering by heating semiconductor package 85 and third substrate 33 for 4 minutes or more in such a manner that a peak temperature ranges from 220° C. to 260° C., inclusive; step E4: forming fourth solder bump 88 on land 63; step F4: printing on fourth pad 88 a fourth paste thermosetting resin composition containing solder powder that has a melting point ranging from 100° C. to 240° C., inclusive, a benzoxazine compound having two or more oxazine rings, an activator, and a thixotropy imparting agent; step G4: disposing fourth solder bump 88 on fourth pad 24; and step H4; performing reflow soldering by heating semiconductor package 85, third substrate 33, and fourth substrate 34 for 4 minutes or more in such a manner that a peak temperature ranges from 220° C. to 260° C., inclusive. This makes an aggregation state of the solder powder excellent.

One of or both the third paste thermosetting resin composition and the fourth paste thermosetting resin composition may also contain a di- or higher functional oxetane compound.

One of or both third solder bump 86 and fourth solder bump 88 may be formed of one or more types of solder selected from the group consisting of Sn—Ag—Cu solder and Sn—Bi solder.

The solder powder may be formed of powder of one or more types of solder selected from the group consisting of Sn—Ag—Cu solder and Sn—Bi solder.

One of or both the third paste thermosetting resin composition and the fourth paste thermosetting resin composition may also contain a di- or higher functional epoxy compound.

A temperature rise rate to reach the peak temperature may range from 1° C./s to 4° C./s, inclusive.

EXAMPLES

Hereinafter, the present invention is specifically described by way of examples.
[Paste Thermosetting Resin Composition]
Following components are used as constitutional components of paste thermosetting resin compositions.
(Solder Powder)
Powder of Sn—Ag—Cu solder (SAC305(Sn-3.0Ag-0.5Cu))
Powder of Sn—Bi solder (Sn-58Bi)
(Thermosetting Resin Binder)
<Main Agent>
Oxetane compound represented by formula (O1) ("ETERNACOLL OXBP" (abbreviation OXBP) manufactured by Ube Industries, Ltd.)
Oxetane compound represented by formula (O2) ("ETERNACOLL OXIPA" (abbreviation OXIPA) manufactured by Ube Industries, Ltd.)

Oxetane compound represented by formula (O3) ("OXT-121" (abbreviation XDO) manufactured by Toagosei Co., Ltd.)
Epoxy compound ("Epikote 806" (bisphenol F epoxy resin) manufactured by Mitsubishi Chemical Corporation)
<Curing Agent>
Benzoxazine compound represented by formula (B1) ("Pd" manufactured by SHIKOKU CHEMICALS CORPORATION)
Benzoxazine compound represented by formula (B2) ("BF-BXZ" (bisphenol F) manufactured by Konishi Chemical Ind. Co., Ltd.)
Benzoxazine compound represented by formula (B3) ("BS-BXZ" (bisphenol 5) manufactured by Konishi Chemical Ind. Co., Ltd.)
(Curing Accelerator)
2-phenyl-4,5-dihydroxymethylimidazole ("2PHZ-PW" manufactured by SHIKOKU CHEMICALS CORPORATION)
(Activator)
Glutaric acid
Triethanolamine
(Thixotropy Imparting Agent)
Amide wax ("ITOHWAX J-420" (N-hydroxyethyl-12-hydroxystearylamide) manufactured by Itoh Oil Chemicals Co., Ltd.)

Examples 1 to 17

Paste thermosetting resin compositions of Examples 1 to 17 are manufactured as follows. (Table 1) shows contents of the constitutional components.

The thixotropy imparting agent, the oxetane compound, and the epoxy compound (unused in Example 10) are blended and heated to dissolve the thixotropy imparting agent, thus giving a first mixture.

The first mixture is blended with the activator and the curing agent and kneaded with a planetary mixer to give a second mixture. The activator and the curing agent are used that have been sifted through a sieve having a mesh of 120.

The second mixture is blended with the solder powder and continuously kneaded with the planetary mixer to give a paste thermosetting resin composition.

Comparative Example 1

A paste thermosetting resin composition of Comparative Examples 1 is manufactured as follows. (Table 1) shows contents of the constitutional components.

The thixotropy imparting agent and the epoxy compound are blended and heated to dissolve the thixotropy imparting agent, thus giving a first mixture.

The first mixture is blended with the activator and the curing accelerator and kneaded with a planetary mixer to give a second mixture. The activator and the curing accelerator are used that have been sifted through a sieve having a mesh of 120.

The second mixture is blended with the solder powder and continuously kneaded with the planetary mixer to give a paste thermosetting resin composition.
(Solder Ball Test)

The paste thermosetting resin compositions obtained as described above are used, as samples, and subjected to a solder ball test specified in Standard JIS Z 3284 Appendix 11. A temperature of a solder bath is set to 240° C. and a heating period is set to 6 minutes. A degree of aggregation of solder is evaluated according to following levels 1 to 5, denoting the levels 1 to 3 as "GD," the level 4 as "OK," and the level 5 as "NG."
<Level 1>
The solder powder is melted to form one large sphere of solder, having no solder ball around the sphere.
<Level 2>
The solder powder is melted to form one large sphere of solder, having, around the sphere, three or less solder balls with a diameter of 75 μm or less.
<Level 3>
The solder powder is melted to form one large sphere of solder, having, around the sphere, four or more solder balls with a diameter of 75 μm or less and having the solder balls not lined in a semicontinuous ring.
<Level 4>
The solder powder is melted to form one large sphere of solder, having, around the sphere, many fine spheres lined in a semicontinuous ring.
<Level 5>
The aggregation of solder is in a state other than described above.
(Degree of Curing of Resin)

A degree of curing of a resin that has been subjected to the solder ball test is evaluated according to following levels 1 to 3, denoting the level 1 as "GD," the level 2 as "OK," and the level 3 as "NG."
<Level 1>
The resin is sufficiently cured.
<Level 2>
The resin slightly has an uncured portion.
<Level 3>
The resin has an uncured portion to give tackiness.

TABLE 1

| | | | | | | Example | | | | | | | | |
|---|---|---|---|---|---|---|---|---|---|---|---|---|---|---|
| | | | | | | 1 | 2 | 3 | 4 | 5 | 6 | 7 | 8 | 9 |
| Solder powder | Sn—Ag—Cu | | SAC305 | part by mass | 560 | 560 | 560 | 560 | 560 | 560 | 560 | 560 | 560 |
| | Sn—Bi | | Sn—58Bi | part by mass | | | | | | | | | |
| Thermosetting resin binder | Main agent | Oxetane compound | OXBP (formula (O1)) | part by mass | | | 75 | | | 75 | | | 75 |
| | | | OXIPA (formula (O2)) | part by mass | | 75 | | | 75 | | | 75 | |
| | | | XDO (formula (O3)) | part by mass | 75 | | | 75 | | | 75 | | |
| | | Epoxy compound | Epikote 806 | part by mass | 25 | 25 | 25 | 25 | 25 | 25 | 25 | 25 | 25 |
| | Curing agent | Benzoxazine compound | P-d (formula (B1)) | part by mass | | | | | 25 | 25 | 25 | | |
| | | | BF-BXZ (formula (B2)) | part by mass | 25 | 25 | 25 | | | | | | |

TABLE 1-continued

|  |  |  | | | | | | | | | | |
|---|---|---|---|---|---|---|---|---|---|---|---|---|
|  | | BS-BXZ (formula (B3)) | part by mass | | | | | | | 25 | 25 | 25 |
| Curing accelerator | | 2PHZ-PW | part by mass | | | | | | | | | |
| Activator | | Glutaric acid | part by mass | 10 | 10 | 10 | 10 | 10 | 10 | 10 | 10 | 10 |
| | | Triethanolamine | part by mass | 20 | 20 | 20 | 20 | 20 | 20 | 20 | 20 | 20 |
| Thixotropy imparting agent | Amide wax | ITOHWAX J-420 | part by mass | 5 | 5 | 5 | 5 | 5 | 5 | 5 | 5 | 5 |
| Evaluation item | | Solder ball test | | GD | GD | GD | GD | GD | GD | GD | GD | GD |
| | | Degree of curing of resin | | GD | GD | GD | GD | GD | GD | GD | GD | GD |

|  |  |  |  |  | | Example | | | | | | | Comparative Example |
|---|---|---|---|---|---|---|---|---|---|---|---|---|---|
|  | | | | | 10 | 11 | 12 | 13 | 14 | 15 | 16 | 17 | 1 |
| Solder powder | Sn—Ag—Cu | | SAC305 | part by mass | 560 | 560 | 560 | 620 | 500 | 480 | 640 | | |
| | Sn—Bi | | Sn—58Bi | part by mass | | | | | | | | 560 | 520 |
| Thermosetting resin binder | Main agent | Oxetane compound | OXBP (formula (O1)) | part by mass | | | | | | | | | |
| | | | OXIPA (formula (O2)) | part by mass | | | | | | | | | |
| | | | XDO (formula (O3)) | part by mass | 100 | 50 | 45 | 75 | 75 | 75 | 75 | 75 | |
| | | Epoxy compound | Epikote 806 | part by mass | | 50 | 55 | 25 | 25 | 25 | 25 | 25 | 100 |
| | Curing agent | Benzoxazine compound | P-d (formula (B1)) | part by mass | | | | | | | | | |
| | | | BF-BXZ (formula (B2)) | part by mass | 25 | 25 | 25 | 40 | 10 | 5 | 45 | 25 | |
| | | | BS-BXZ (formula (B3)) | part by mass | | | | | | | | | |
| Curing accelerator | | 2PHZ-PW | | part by mass | | | | | | | | | 15 |
| Activator | | Glutaric acid | | part by mass | 10 | 10 | 10 | 10 | 10 | 10 | 10 | 10 | 10 |
| | | Triethanolamine | | part by mass | 20 | 20 | 20 | 20 | 20 | 20 | 20 | 20 | 20 |
| Thixotropy imparting agent | Amide wax | ITOHWAX J-420 | | part by mass | 5 | 5 | 5 | 5 | 5 | 5 | 5 | 5 | 5 |
| Evaluation item | | Solder ball test | | | GD | GD | OK | GD | GD | GD | OK | GD | NG |
| | | Degree of curing of resin | | | GD | GD | GD | GD | GD | OK | GD | GD | GD |

As is clearly confirmed in (Table 1), in contrast with a result that the aggregation of the solder powder melted is inhibited in Comparative Example 1 where no oxetane compound is used but the curing accelerator is used, the aggregation of the solder powder melted is less likely to be inhibited in Examples 1 to 17 where the oxetane compound is used.

As is clearly confirmed in (Table 1), in contrast with a result that the aggregation of the solder powder melted is inhibited in Comparative Example 1 where no benzoxazine compound is used but the curing accelerator is used, the aggregation of the solder powder melted is less likely to be inhibited in Examples 1 to 17 where the benzoxazine compound is used but the curing accelerator is not used.

Comparison of Examples 1, 10, and 11 with Example 12 demonstrates that the oxetane compound is preferably 50% by mass or more relative to a total mass of the main agent. That is, delay of a curing reaction caused by the oxetane compound is dominant in Examples 1, 10, and 11, so that the aggregation of the solder powder melted is less likely to be inhibited. In contrast, the acceleration of a curing reaction caused by the epoxy compound is a little bit dominant in Example 12, so that the aggregation of the solder powder melted is slightly inhibited.

An evaluation result of Example 15 demonstrates that an uncured portion is slightly generated in a cured product of the thermosetting resin binder when the benzoxazine compound is less than 10 parts by mass relative to 100 parts by mass of the main agent.

An evaluation result of Example 16 demonstrates that the curing of the thermosetting resin binder is a little bit accelerated to slightly inhibit the aggregation of the solder powder melted when the benzoxazine compound is more than 40 parts by mass relative to 100 parts by mass of the main agent.

INDUSTRIAL APPLICABILITY

A paste thermosetting resin composition of the present invention is useful for, for example, a semiconductor component and a semiconductor mounted article.

REFERENCE MARKS IN THE DRAWINGS 2 semiconductor component
3 semiconductor mounted article
4 solder powder
5 semiconductor package
6 first solder bump
7 first thermosetting resin binder
8 second solder bump
9 gap
11 first paste thermosetting resin composition
12 second paste thermosetting resin composition
13 third paste thermosetting resin composition
14 fourth paste thermosetting resin composition
21 first pad
22 second pad 23 third pad
24 fourth pad
31 first substrate
32 second substrate
33 third substrate
34 fourth substrate
41 first solder bonding part
42 second solder bonding part
43 third solder bonding part
44 fourth solder bonding part
51 first resin reinforcing part
52 second resin reinforcing part
53 third resin reinforcing part
54 fourth resin reinforcing part
61 land
63 land
82 semiconductor component
83 semiconductor mounted article
84 solder powder
85 semiconductor package
86 third solder bump
87 third thermosetting resin binder
88 fourth solder bump
89 gap

The invention claimed is:

1. A paste thermosetting resin composition comprising:
solder powder;
a thermosetting resin binder;
an activator; and
a thixotropy imparting agent,
the solder powder having a melting point ranging from 100° C. to 240° C., inclusive,
the thermosetting resin binder containing a main agent and a curing agent,
the main agent containing a di- or higher functional oxetane compound, and
the curing agent containing a benzoxazine compound having two or more oxazine rings.

2. The paste thermosetting resin composition according to claim 1,
wherein the oxetane compound is one or more compounds selected from the group consisting of following formulae (O1) to (O3)

[Chemical 1]

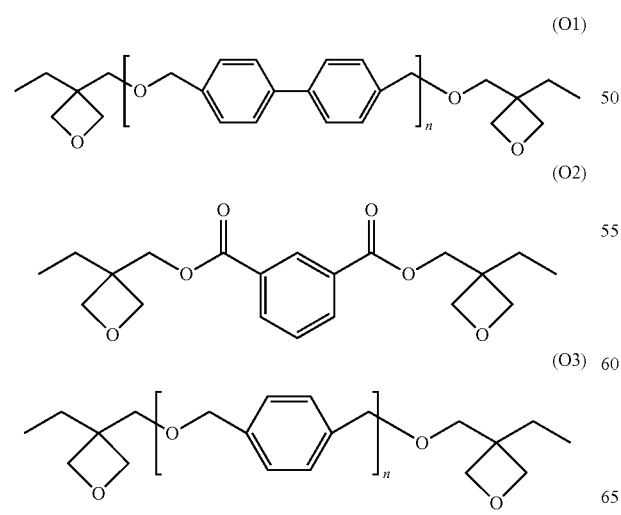

wherein in both the formulae (O1) and (O3), n is an integer of 1 to 3.

3. The paste thermosetting resin composition according to claim 1,
wherein the oxetane compound is 50% by mass or more relative to a total mass of the main agent.

4. The paste thermosetting resin composition according to claim 1,
wherein the solder powder is powder of Sn—Ag—Cu solder.

5. The paste thermosetting resin composition according to claim 1,
wherein the solder powder is powder of Sn—Bi solder.

6. The paste thermosetting resin composition according to claim 1,
wherein the solder powder has an average particle size ranging from 3 μm to 30 μm, inclusive.

7. The paste thermosetting resin composition according to claim 1,
wherein the main agent contains a di- or higher functional epoxy compound.

8. The paste thermosetting resin composition according to claim 1,
wherein the activator contains one or more compounds selected from the group consisting of glutaric acid and triethanolamine.

9. The paste thermosetting resin composition according to claim 1,
wherein the thixotropy imparting agent contains amide wax.

10. The paste thermosetting resin composition according to claim 1,
wherein the benzoxazine compound is one or more compounds selected from the group consisting of following formulae (B1) to (B3).

[Chemical 3]

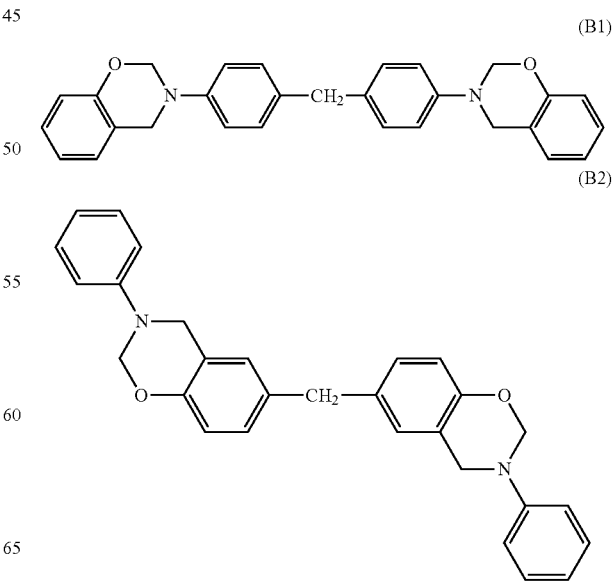

-continued (B3)

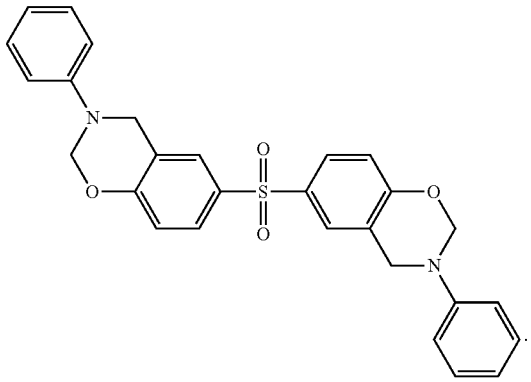

11. The paste thermosetting resin composition according to claim 1,
wherein the benzoxazine compound ranges from 10 parts by mass to 40 parts by mass, inclusive, relative to 100 parts by mass of the main agent.

12. The paste thermosetting resin composition according to claim 1,
wherein the oxetane compound is 50% by mass or more relative to a total mass of the main agent, and
the benzoxazine compound ranges from 10 parts by mass to 40 parts by mass, inclusive, relative to 100 parts by mass of the main agent.

13. A semiconductor component comprising:
a semiconductor package;
a first substrate on a first surface of which a first pad is formed;
a first solder bonding part that electrically connects the semiconductor package with the first pad; and
a first resin reinforcing part that is formed in contact with the first solder bonding part and reinforces the first solder bonding part,
the first resin reinforcing part being formed of a cured product of a first thermosetting resin binder containing a di- or higher functional oxetane compound and a benzoxazine compound having two or more oxazine rings.

14. The semiconductor component according to claim 13,
wherein the first solder bonding part has a melting point ranging from 100° C. to 240° C., inclusive.

15. The semiconductor component according to claim 13,
wherein the first solder bonding part is formed of one or more types of solder selected from the group consisting of Sn—Ag—Cu solder and Sn—Bi solder.

16. The semiconductor component according to claim 13,
wherein the first thermosetting resin binder contains a di- or higher functional epoxy compound.

17. The semiconductor component according to claim 13,
wherein an entire side surface of the first solder bonding part is covered with the first resin reinforcing part so that the first solder bonding part is not exteriorly exposed.

18. A semiconductor mounted article comprising:
a semiconductor package;
a first substrate having a first surface on which a first pad is formed and a second surface on which a land is formed, the second surface opposing the first surface;
a first solder bonding part that electrically connects the semiconductor package with the first pad;
a first resin reinforcing part that is formed in contact with the first solder bonding part and reinforces the first solder bonding part;
a second substrate on one surface of which a second pad is formed;
a second solder bonding part that electrically connects the land with the second pad; and
a second resin reinforcing part that is formed in contact with the second solder bonding part and reinforces the second solder bonding part,
the first resin reinforcing part being formed of a cured product of a first thermosetting resin binder containing a di- or higher functional oxetane compound and a benzoxazine compound having two or more oxazine rings, and
the second resin reinforcing part being formed of a cured product of a second thermosetting resin binder containing a di- or higher functional oxetane compound and a benzoxazine compound having two or more oxazine rings.

19. The semiconductor mounted article according to claim 18,
wherein the first solder bonding part and the second solder bonding part have a melting point ranging from 100° C. to 240° C., inclusive.

20. The semiconductor mounted article according to claim 18,
wherein the first solder bonding part and the second solder bonding part are formed of one or more types of solder selected from the group consisting of Sn—Ag—Cu solder and Sn—Bi solder.

21. The semiconductor mounted article according to claim 18,
wherein one of or both the first thermosetting resin binder and the second thermosetting resin binder contain a di- or higher functional epoxy compound.

22. The semiconductor mounted article according to claim 18,
wherein an entire side surface of the first solder bonding part is covered with the first resin reinforcing part so that the first solder bonding part is not exteriorly exposed, and
an entire side surface of the second solder bonding part is covered with the second resin reinforcing part so that the second solder bonding part is not exteriorly exposed.

23. A method for manufacturing a semiconductor component, the method comprising: step A1: preparing a semiconductor package a second surface of which a first solder bump is formed and a first substrate a first surface of which, in other words, on an opposite side to the second surface, a first pad is formed;
step B1: printing on the first pad a first paste thermosetting resin composition containing solder powder that has a melting point ranging from 100° C. to 240° C., inclusive, a di- or higher functional oxetane compound, a benzoxazine compound having two or more oxazine rings, an activator, and a thixotropy imparting agent;
step C1: disposing the first solder bump on the first pad; and
step D1: performing reflow soldering by heating the semiconductor package and the first substrate for 4 minutes or more in such a manner that a peak temperature ranges from 220° C. to 260° C., inclusive.

24. The method for manufacturing a semiconductor component according to claim 23, wherein the first solder bump is formed of one or more types of solder selected from the group consisting of Sn—Ag—Cu solder and Sn—Bi solder.

25. The method for manufacturing a semiconductor component according to claim 23,
wherein the solder powder is formed of powder of one or more types of solder selected from the group consisting of Sn—Ag—Cu solder and Sn—Bi solder.

26. The method for manufacturing a semiconductor component according to claim 23,
wherein the first paste thermosetting resin composition contains a di- or higher functional epoxy compound.

27. The method for manufacturing a semiconductor component according to claim 23,
wherein a temperature rise rate to reach the peak temperature ranges from 1° C./s to 4° C./s, inclusive.

28. A method for manufacturing a semiconductor mounted article, the method comprising:
step A2: preparing a semiconductor package on one surface of which a first solder bump is formed, a first substrate on a first surface of which a first pad is formed and a second surface of which, in other words, on an opposite side from the first surface, a land is formed, and a second substrate on one surface of which a second pad is formed;
step B2: printing on the first pad a first paste thermosetting resin composition containing so/der powder that has a meting point ranging from 100° C. to 240° C., inclusive, a di- or higher functional oxetane compound, a benzoxazine compound having two or more oxazine rings, an activator, and a thixotropy imparting agent;
step C2: disposing the first solder bump on the first pad;
step D2: performing reflow soldering by heating the semiconductor package and the first substrate for 4 minutes or more in such a manner that a peak temperature ranges from 220° C. to 260° C., inclusive;
step E2: forming a second solder bump on the land;
step F2: printing on the second pad a second paste thermosetting resin composition containing solder powder that has a melting point ranging from 100° C. to 240° C., inclusive, a di- or higher functional oxetane compound, a benzoxazine compound having two or more oxazine rings, an activator, and a thixotropy imparting agent;
step G2: disposing the second solder bump on the second pad; and
step H2: performing reflow soldering by heating the semiconductor package, the first substrate, and the second substrate for 4 minutes or more in such a manner that a peak temperature ranges from 220° C. to 260° C., inclusive.

29. The method for manufacturing a semiconductor mounted article according to claim 28,
wherein one of or both the first solder bump and the second solder bump are formed of one or more types of solder selected from the group consisting of Sn—Ag—Cu solder and Sn—Bi solder.

30. The method for manufacturing a semiconductor mounted article according to claim 28,
wherein the solder powder is formed of powder of one or more types of solder selected from the group consisting of Sn—Ag—Cu solder and Sn—Bi solder.

31. The method for manufacturing a semiconductor mounted article according to claim 28,
wherein one of or both the first paste thermosetting resin composition and the second paste thermosetting resin composition contain a di- or higher functional epoxy compound.

32. The method for manufacturing a semiconductor mounted article according to claim 28,
wherein a temperature rise rate to reach the peak temperature ranges from 1° C./s to 4° C./s, inclusive.

* * * * *